(12) United States Patent
Matsubayashi et al.

(10) Patent No.: US 8,860,304 B2
(45) Date of Patent: Oct. 14, 2014

(54) LIGHT EMITTING SHEET AND MANUFACTURING METHOD THEREOF

(75) Inventors: Yumiko Matsubayashi, Tokyo (JP); Satoshi Naganawa, Tokyo (JP); Yoshitomo Ono, Tokyo (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 13/390,715

(22) PCT Filed: Jul. 8, 2010

(86) PCT No.: PCT/JP2010/061624
§ 371 (c)(1),
(2), (4) Date: Feb. 16, 2012

(87) PCT Pub. No.: WO2011/021447
PCT Pub. Date: Feb. 24, 2011

(65) Prior Publication Data
US 2012/0146485 A1    Jun. 14, 2012

(30) Foreign Application Priority Data

Aug. 19, 2009 (JP) .................. 2009-190356

(51) Int. Cl.
*H05B 33/22* (2006.01)
*H05B 33/26* (2006.01)
*H01L 51/50* (2006.01)
*H05B 33/10* (2006.01)

(52) U.S. Cl.
CPC ............... *H01L 51/50* (2013.01); *H05B 33/10* (2013.01)
USPC .......................................... 313/509; 313/511

(58) Field of Classification Search
USPC ............ 313/498–512; 315/169.3; 345/36, 45, 345/76
See application file for complete search history.

(56) References Cited

U.S. PATENT DOCUMENTS

| 5,432,015 A | 7/1995 | Wu et al. |
| 5,634,835 A | 6/1997 | Wu et al. |

(Continued)

FOREIGN PATENT DOCUMENTS

| CN | 101334552 A | 12/2008 |
| JP | 03 019296 | 2/1991 |

(Continued)

OTHER PUBLICATIONS

International Search Report Issued Aug. 10, 2010 in PCT/JP10/061624 Filed Jul. 8, 2010.

(Continued)

*Primary Examiner* — Nimeshkumar Patel
*Assistant Examiner* — Christopher Raabe
(74) *Attorney, Agent, or Firm* — Oblon, Spivak, McClelland, Maier & Neustadt, L.L.P.

(57) ABSTRACT

A light-emitting sheet which does not cause failures such as a short circuit without causing dielectric breakdown at the end of element at applying a voltage and which is able to realize stable driving, and an efficient method for producing the light-emitting sheet, are provided. Specifically, a light-emitting sheet having a first electrode, a second electrode, and a light-emitting layer disposed between the first and the second electrodes, wherein a short circuit preventing member composed of an insulator is arranged on the periphery of the light-emitting layer in such a way that a part of the member is projected from the light-emitting layer, and an efficient method for producing the light-emitting sheet, are provided.

20 Claims, 10 Drawing Sheets

(56) References Cited

U.S. PATENT DOCUMENTS

| | | | |
|---|---|---|---|
| 5,679,472 | A | 10/1997 | Wu et al. |
| 5,702,565 | A | 12/1997 | Wu et al. |
| 5,756,147 | A | 5/1998 | Wu et al. |
| 5,858,561 | A | 1/1999 | Epstein et al. |
| 5,936,469 | A | 8/1999 | Alexander et al. |
| 6,465,969 | B1 | 10/2002 | Murasko et al. |
| 6,712,661 | B1 | 3/2004 | Kiguchi et al. |
| 2001/0035716 | A1 | 11/2001 | Murasko |
| 2001/0042329 | A1 | 11/2001 | Murasko et al. |
| 2002/0011786 | A1 | 1/2002 | Murasko et al. |
| 2004/0058615 | A1 | 3/2004 | Murasko et al. |
| 2004/0265481 | A1* | 12/2004 | Kobayashi ............ 427/66 |
| 2006/0157103 | A1* | 7/2006 | Sheats et al. ............ 136/244 |
| 2009/0001882 | A1 | 1/2009 | Park |
| 2011/0315972 | A1* | 12/2011 | Takahashi et al. ............ 257/40 |

FOREIGN PATENT DOCUMENTS

| | | |
|---|---|---|
| JP | 03 093188 | 4/1991 |
| JP | 4-190586 | 7/1992 |
| JP | 06 013179 | 1/1994 |
| JP | 07 235380 | 9/1995 |
| JP | 2003 045647 | 2/2003 |
| JP | 2004 234942 | 8/2004 |
| JP | 2004 235167 | 8/2004 |
| JP | 2004 531025 | 10/2004 |
| JP | 2008 041381 | 2/2008 |
| JP | 2008-108680 A | 5/2008 |
| JP | 2008 123700 | 5/2008 |

OTHER PUBLICATIONS

U.S. Appl. No. 13/391,131, filed Feb. 17, 2012, Matsubayashi et al.

Official Action issued Jan. 20, 2014 in corresponding China Patent Application No. 2010800366732.2 filed Jul. 8, 2010.

Extended European Search Report issued Dec. 12, 2013 in European Application No. 10 80 9792 filed Jul. 8, 2010.

U.S. Appl. No. 13/523,591, filed Jun. 14, 2012, Naganawa, et al.

* cited by examiner

LAMINATE 1

LAMINATE 2

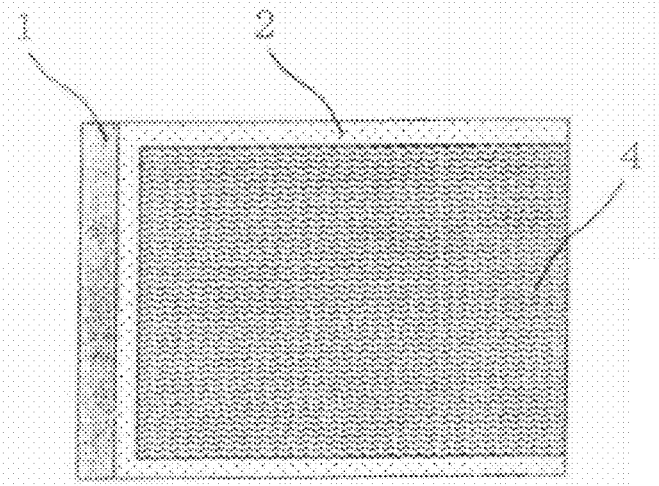
LAMINATE 3
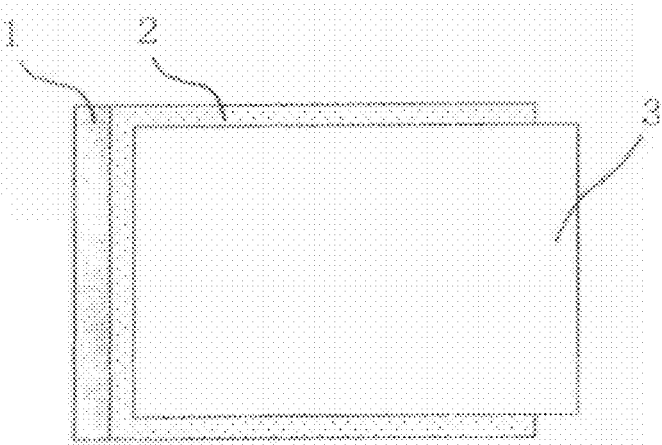
LIGHT EMITTING SHEET A

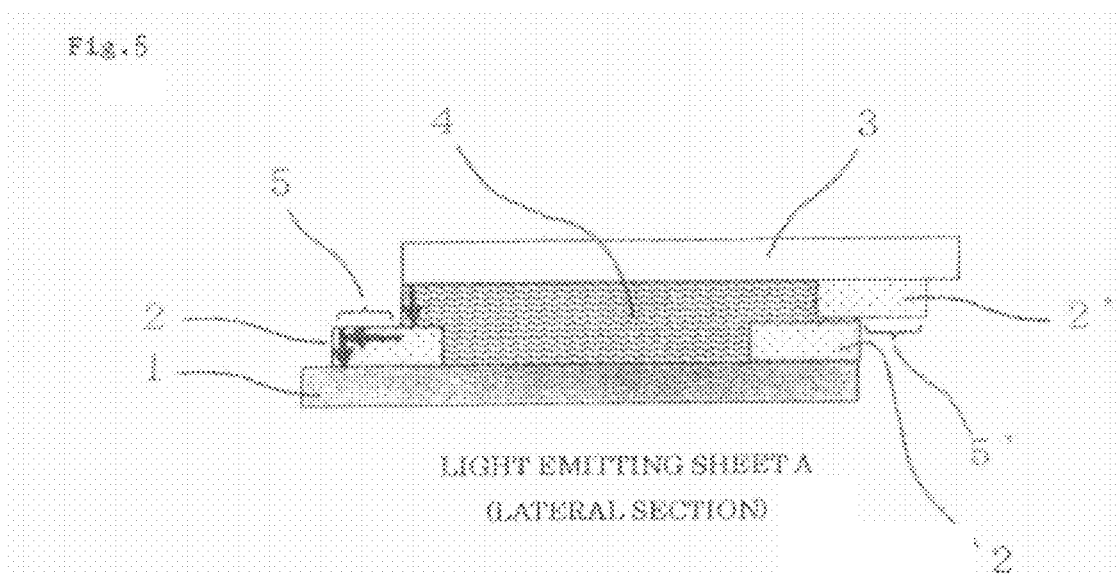
LIGHT EMITTING SHEET A
(LATERAL SECTION)
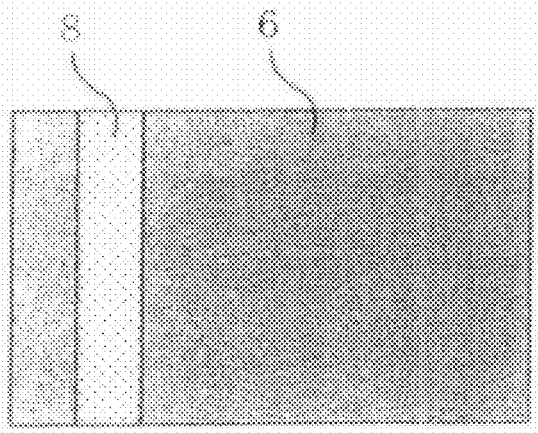
LAMINATE 1

LAMINATE 5

LAMINATE 6

LIGHT EMITTING SHEET F

LIGHT EMITTING SHEET F
(LATERAL SECTION)

LIGHT EMITTING SHEET F

LIGHT EMITTING SHEET F
(VERTICAL SECTION)

LAMINATE 7

LAMINATE 8

LAMINATE 9

LIGHT EMITTING SHEET H'

LIGHT EMITTING SHEET H
(WIDTH DIRECTION SECTION)

LIGHT EMITTING SHEET H

LIGHT EMITTING SHEET H
(FLOW DIRECTION SECTION)

LIGHT EMITTING SHEET

LIGHT EMITTING SHEET AND MANUFACTURING METHOD THEREOF

TECHNICAL FIELD

The present invention relates to a light-emitting sheet and a method for producing thereof. In particular, the present invention relates to a light-emitting sheet which does not cause failures such as a short circuit, and which is able to realize stable driving, and an efficient method for producing the light-emitting sheet.

BACKGROUND ART

As functional elements in the electric/electronic field or the optical field, there is known an electroluminescent device capable of emitting light by applying a voltage. In general, this electroluminescent element can be roughly classified into an inorganic electroluminescent element using an inorganic electroluminescent material for a light-emitting layer (hereinafter referred to as "inorganic EL element") and an organic electroluminescent element using an organic electroluminescent material for a light-emitting layer (hereinafter referred to as "organic EL element").

In comparison with the organic EL element, the inorganic EL device is hard to cause light emission with high luminance, it has an advantage that not only it is excellent in long-term stability, but it stably causes light-emission even under a severe condition such as a high temperature. For that reason, in order to utilize it in fields where weather resistance, heat resistance, long-term stability, or the like is required, studies regarding the inorganic EL element are being continued.

Also, the inorganic EL element enables a device to be formed on paper or a polymer film by a printing technique, and it forms a market as an illumination device in which flexibility is required. As such an inorganic EL element, there is known an electroluminescent element in which an insulating layer and a light-emitting layer are formed on a back-side electrode, a transparent electrode is provided thereon, and the top and bottom thereof are covered with a hygroscopic film. The light-emitting layer is printed by means of screen printing or the like (see, for example, Patent Document 1). However, such a technique requires a lot of manufacturing processes. For that reason, as a method capable of achieving mass production, there is known a method of inexpensively manufacturing an inorganic EL element by means of roll printing and lamination (see, for example, Patent Document 2).

PRIOR ART DOCUMENTS

Patent Documents

Patent Document 1: JP-B-7-58636
Patent Document 2: JP-A-2004-234942

SUMMARY OF THE INVENTION

Problem to be Solved by the Invention

In inorganic EL elements manufactured by the conventional methods, because the upper and lower are come to close one another at the end of element, dielectric breakdown possibly occurs by application of a voltage, so problems such as a short circuit are frequently caused.

To solve the above problem, the present invention provides a light-emitting sheet having high dielectric strength properties and capable of suppressing failures such as a short circuit and the like, and an efficient method for producing thereof.

Means for Solving the Problem

That is, the present invention relates to the following [1] to [9].

[1] A light-emitting sheet having a first electrode, a second electrode and a light-emitting layer disposed between the first and the second electrodes, wherein
a short circuit preventing member composed of an insulator is arranged on a periphery of the light-emitting layer in such a way that a part of the member is projected from the light-emitting layer.

[2] A light-emitting sheet having a first electrode, a second electrode, and a light-emitting layer disposed between the first and second electrodes, wherein
a short circuit preventing member composed of an insulator is arranged on at least a part of the periphery of the light-emitting layer in such a way that apart of the member is projected from the light-emitting layer; and
on the periphery of the light-emitting layer in which the short circuit preventing member is not arranged or not arranged in such a way that a part of the member is projected from the light-emitting layer, the first electrode and/or the second electrode is cut to form a non-conductive section being electrically disconnected from a circuit for applying a voltage to the light-emitting sheet.

[3] The light-emitting sheet according to [2], wherein the first electrode and/or the second electrode is cut with a laser.

[4] The light-emitting sheet according to any one of [1] to [3], wherein the short circuit preventing member is projected from the light-emitting layer in such a way that a minimum value of a creepage distance between the first electrode and the second electrode is 2 mm or more.

[5] The light-emitting sheet according to any one of [2] to [4], wherein by cutting of the electrode or electrodes, a minimum value of a creepage distance between a conductive section of the first electrode and a conductive section of the second electrode, which are electrically connected to each other, is 2 mm or more.

[6] The light-emitting sheet according to any one of [1] to [5], wherein the short circuit preventing member is a pressure-sensitive adhesive sheet having insulating property.

[7] The light-emitting sheet according to any one of [1] to [6], having a dielectric layer between the first electrode or the second electrode and the light-emitting layer.

[8] A method for producing a light-emitting sheet having a first electrode, a second electrode and a light-emitting layer disposed between the first and the second electrodes, wherein
the light-emitting sheet is produced using a roll-to-roll process, and a short circuit preventing member composed of an insulator is arranged on the peripheries of both sides of the light-emitting layer in a flow direction of the light-emitting layer in such a way that a part of the member is projected from the light-emitting layer; and
the first electrode and/or the second electrode is cut along a width direction to form a non-conductive section being electrically disconnected from a circuit for applying a voltage to the light-emitting sheet.

[9] A method for producing a light-emitting sheet having a first electrode, a second electrode and a light-emitting layer disposed between the first and the second electrodes, wherein
the light-emitting sheet is produced using a roll-to-roll process, a short circuit preventing member composed of an insulator is arranged on the periphery of one side of the light-emitting layer along a flow direction of the light-emitting layer in such a way that part of the member is projected from the light-emitting layer, and the electrode disposed on or under the periphery of another side of the light-emitting layer is cut to form a non-conductive section being electrically disconnected with a circuit for applying a voltage to the light-emitting sheet; and the first electrode and/or the second electrode is cut along a width direction to form a non-conductive section being electrically disconnected with a circuit for applying a voltage to the light-emitting sheet.

Effect of the Invention

According to the present invention, it is possible to provide a light-emitting sheet in which by application of a voltage, problems such as a short circuit and dielectric breakdown will not occur at the ends of the element and be able to realize stable driving, and an efficient method for producing thereof.

BRIEF DESCRIPTION OF THE DRAWINGS

FIG. 3 is a diagram showing that a light-emitting layer is formed on the first electrode surface and the short circuit preventing member of the laminate 1 in such a way that a part of an upper side, a lower side and a left side of the short circuit preventing member is projected from the light-emitting layer (laminate 3).

FIG. 4 is a diagram showing a light-emitting sheet A having laminate 2 laminated on the laminate 3.

FIG. 5 is a lateral cross-sectional view of the light-emitting sheet A.

FIG. 6 is a diagram showing that a short circuit preventing member is laminated (arranged) linearly along a vertical direction on the left side of a first electrode of a first electrode substrate (laminate 4).

MODES FOR CARRYING OUT THE INVENTION

Figure 20:
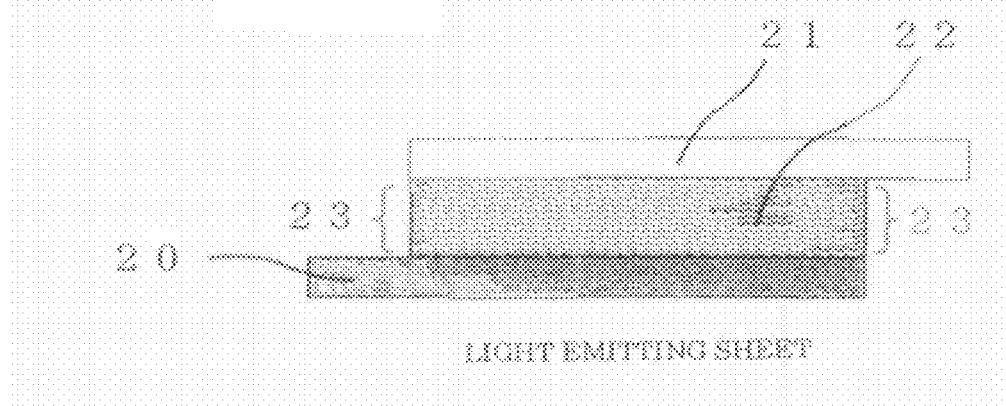
FIG. 20 is a diagram explaining a position of the "periphery" of a light-emitting layer.

The light-emitting sheet of the present invention is a light-emitting sheet having a first electrode, a second electrode and a light-emitting layer disposed between those electrodes, wherein a short circuit preventing member composed of an insulator is arranged on a periphery of the light-emitting layer (hereinafter referred to as "light-emitting layer periphery") in such a way that part of the member is projected from the light-emitting layer. Here, the term "light-emitting layer periphery" is a side surface site of the light-emitting layer which does not face any of the first electrode and the second electrode, and in FIG. 20 showing a lateral cross-sectional view of a light-emitting sheet in which no short circuit preventing member is laminated, the light-emitting layer periphery means a side surface site 23 of a light-emitting layer 22 laminated between a first electrode substrate 20 and a second electrode substrate 21. A planar shape of the light-emitting sheet is not particularly limited, and it may be any of a quadrilateral-shape such as a square, a rectangle, a trapezoid, a rhombus or the like, a triangle, a circle, an ellipse, and a star.

Hereinafter, a light-emitting sheet in which the first electrode is a cathode, the second electrode is an anode, the first substrate side is a back, and the second substrate is a front is explained as an example, but it should not be limited thereto.
(Substrate for Electrodes)

It is preferred that the first electrode (cathode) and the second electrode (anode) is formed on an each substrate (hereinafter, a substrate for the first electrode and a substrate for the second electrode are referred to as "first substrate" and "second substrate", respectively; and a laminate of the first electrode on the first substrate and a laminate of the second electrode on the second substrate are referred to as "first electrode substrate" and "second electrode substrate", respectively). As the first substrate and the second substrate, for example, glass plates or plastic films can be used; however, plastic films are preferred from the point of view that they have flexibility and are able to reduce the weight. As the plastic films, films which may not permeate moisture or whose moisture permeability is extremely low are preferred. Also, it is important that the second substrate has transparency.

Materials such as plastic films, polyesters, and polyamides are preferred from the viewpoints of costs and multiplicity of uses. Examples of the polyester include polyethylene terephthalate, polybutylene terephthalate, polyethylene naphthalate, polyarylates. Also, examples of the polyamide include wholly aromatic polyamides, nylon 6, nylon 66, nylon copolymers.

Although a thickness of the substrate to be used is not particularly limited, it is generally from 1 to 1,000 μm, preferably from 5 to 500 μm, and from the viewpoint of practicality, more preferably from 10 to 200 μm.

Here, it is not particularly needed that the first substrate is transparent.

Although the second substrate may be either colorless transparent or colored transparent, it is preferred that the second substrate is colorless transparent from the viewpoint of not scattering or attenuating light emitted from a light-emitting layer as described bellow.

Also, in each of the first substrate and the second substrate, a moisture barrier layer (gas barrier layer) can be provided on its front or back as necessary. As a material of the moisture barrier layer (gas barrier layer), inorganic materials such as silicon nitride and silicon oxide are suitably used. The moisture barrier layer (gas barrier layer) can be, for example, formed by a high-frequency sputtering method or the like.

[First Electrode; Cathode]

The first electrode (cathode) in the light-emitting sheet of the present invention is not particularly limited as far as it has a function as a cathode, and it can be properly selected from known cathodes according to an application of the light-emitting sheet.

Examples of a material of the first electrode include metals, alloys, metal oxides, organic conductive compounds, and mixtures thereof.

Specific examples of the material of the first electrode include gold, silver, lead, aluminum, indium, ytterbium, and alloys or mixture of such a metal and an alkali metal or an alkaline earth metal; organic conductive polymers such as polyaniline, polythiophene, and polypyrrole. These materials may be used alone or as a combination of two or more thereof. Among these materials, it is preferred that its work function is not more than 4.5 eV.

Among these materials, a material mainly composed of aluminum is preferred in regard to its excellent stability. The material mainly composed of aluminum as referred to herein means aluminum alone, or an alloy or a mixture of aluminum and about 0.01 to 10% by mass of an alkali metal or an alkaline earth metal (for example, a lithium-aluminum alloy, a magnesium-aluminum alloy, and the like).

Since the formation method of the first electrode is not particularly limited, it is possible to form the first electrode by a known method. For example, taking into account the properties of the above-mentioned material, the first electrode can be formed on the first substrate by a method appropriately selected from a wet process such as a printing method and a coating method, a physical process such as a vacuum vapor deposition method, a sputtering method, an ion plating method, a chemical process such as a CVD method (chemical vapor deposition method), a plasma CVD method and a method of laminating metal foils.

For example, in the case of selecting metals such as aluminum as the material of the first electrode, the first electrode can be formed by a method such as sputtering one or two or more kinds of metal on the substrate simultaneously or successively, or laminating metal foils.

Although a thickness of the first electrode can be appropriately selected depending on the material and not be generalized, it is commonly in the range of 10 nm to 50 μm, preferably 20 nm to 20 μm, and more preferably 50 nm to 15 μm. It is noted that this first electrode may be transparent or be opaque. A surface resistivity of the first electrode is preferably not more than $10^2 \Omega/\square$, and more preferably not more than $10^2 \Omega/\square$. The surface resistivity is a value determined by a method described in the Examples.

[Second Electrode; Anode]

The second electrode (anode) in the light-emitting sheet of the present invention is not particularly limited as far as it has a function as an anode, and it can be appropriately selected from known anodes according to an application of the light-emitting sheet.

Examples of the material of the second electrode include metals, alloys, metal oxides, organic conductive compounds, and mixtures thereof.

Specific examples of the material of the second electrode include metal oxides such as tin oxide, antimony-doped tin oxide (ATO), fluorine-doped tin oxide (FTO), zinc oxide, indium oxide, indium tin oxide (ITO), and indium zinc oxide (IZO); metals such as gold, silver, chromium, and nickel; mixture or laminate of these metal oxides and metals; organic conductive polymers such as polyaniline, polythiophene, and polypyrrole. Among these materials, it is preferred that its work function is 4.0 eV or more. ITO is particularly preferred from the viewpoint of its high transparency.

The second electrode can be formed by a known method. For example, taking into account the properties of the above-mentioned material, the second electrode can be formed on the second substrate by a method appropriately selected from a wet process such as a printing method and a coating method, a physical process such as a vacuum vapor deposition method, a sputtering method, and an ion plating method, a chemical process such as CVD and a plasma CVD method.

For example, in the case of selecting ITO as the material of the second electrode, the second electrode can be formed by a method such as direct current or high-frequency sputtering method, a vacuum vapor deposition method, and an ion plating method. Also, in the case of selecting an organic conductive compound as the material of the second electrode, the second electrode can be formed by wet process for forming a film.

Although a thickness of the second electrode can be appropriately selected depending on the material and not be generalized, it is commonly in the range of 10 to 1,000 nm, preferably 20 to 500 nm, and more preferably 50 to 200 nm.

A surface resistivity of the second electrode is preferably not more than $10^3 \Omega/\square$, and more preferably not more than $10^2 \Omega/\square$. The surface resistivity is a value determined by a method described in the Examples.

Though the second electrode may be colorless transparent or colored transparent, it is preferably colorless transparent. Also, in order to allow the escape produced light from the second electrode side, a transmittance of the laminate of the second substrate and the second electrode is preferably 60% or more, and more preferably 70% or more. The transmittance is a value determined by a method described in the Examples.

[Light-Emitting Layer]

In the light-emitting sheet of the present invention, the light-emitting layer can be, for example, formed by coating a light-emitting composition on the first electrode or the second electrode, or a dielectric layer as described bellow. Also, the light-emitting layer may be formed by coating a light-emitting composition on a release film and then transferring it onto the first electrode or the second electrode, or the dielectric layer.

It is possible to use the light-emitting composition which contains an electroluminescent material and a matrix resin. The electroluminescent material and the matrix resin will be sequentially described below.

(Electroluminescent Material)

As the electroluminescent material, any of an inorganic electroluminescent material and an organic electroluminescent material can be used. From the viewpoint of an application of the light-emitting sheet of the present invention, it is preferred to use an inorganic electroluminescent material which is excellent in long-term stability.

—Inorganic Electroluminescent Material—

Examples of the inorganic electroluminescent material include those which a base material of zinc sulfide (ZnS) is doped with copper, manganese, terbium fluoride, samarium fluoride and thulium fluoride as a main luminescent material, i.e. ZnS:Cu, ZnS:Mn, ZnS:TbF$_3$, ZnS:SmF$_3$ and ZnS:TmF$_3$; a base material of calcium sulfide (CaS) is doped with europium as a main luminescent material, i.e. CaS:Eu; a base material of strontium sulfide (SrS) is doped with cerium as a main luminescent material, i.e. SrS:Ce; and a base materials of alkaline earth-based calcium sulfide such as CaCa$_2$S$_4$ and SrCa$_2$S$_4$ is doped with a transition metal such as manganese or a rare earth element such as europium, cerium, and terbium as a main luminescent material.

Among these materials, ZnS:Cu emits green light; ZnS:Mn emits yellowish orange light; ZnS:TbF$_3$ emits green light; ZnS:SmF$_3$ and CaS:Eu emit red light; and ZnS:TmF$_3$ and SrS:Ce emit blue light.

Furthermore, Examples of the inorganic electroluminescent material include oxide light-emitting materials composed of Sc$_2$O$_3$ doped with a rare earth element such as Y, La, Ce, Pr, Nd, Sm, Eu, Gd, Tb, Dy, Ho, Er, Tm, Yb, and Lu, exclusive of Sc. The rare earth element used for doping is preferably Ce, Sm, Eu, Tb, or Tm. Depending on the kind of the rare earth element, the inorganic electroluminescent material emits yellow light, red light which has a longer wavelength than yellow light, or green or blue light which has a shorter wavelength than yellow light.

In the present invention, these inorganic electroluminescent materials may be used alone, or a combination of two or more, if desired.

—Organic Electroluminescent Material—

As the organic electroluminescent material, any of low-molecular weight material and high-molecular weight material can be used. Also, any of fluorescent materials and phosphorescent materials can be used.

Examples of the low-molecular weight organic electroluminescent material include benzoxazole derivatives, benzoimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, perylene derivatives, perinone derivatives, oxadiazole derivatives, aldazine derivatives, pyraridine derivatives, cyclopentadiene derivatives, bisstyrylanthracene derivatives, quinacridone derivatives, pyrrolopyridine derivatives, thiadiazolopyridine derivatives, styrylamine derivatives, aromatic dimethylidene compounds, aromatic diamine derivatives, ortho-metalated complexes such as various metal complexes typified by metal complexes and rare earth complexes of 8-quinolinol derivatives [a generic name of a group of compounds described in, for example, YAMAMOTO Akio, *Organometallic chemistry—principles and applications*, pages 150 and 232, Shokabo Publishing Co., Ltd. (1982); H. Yersin, *Photochemistry and Photophysics of Coordination Compounds*, pages 71 to 77 and 135 to 146, Springer-Verlag (1987)], and porphyrin metal complexes.

Also, Examples of the high-molecular weight organic electroluminescent material include polythiophene derivatives, polyphenylene derivatives, polyphenylene vinylene derivatives, and polyfluorene derivatives, which are a fluorescent material.

In the present invention, as the organic electroluminescent materials, one of the low-molecular weight materials and high-molecular weight materials may be used, or two or more thereof may be used in combination.

In the case where the light-emitting layer is made of an organic electroluminescent material, it is preferred to form a hole injection/transport layer on the anode side of the light-emitting layer and an electron injection/transport layer on the cathode side thereof, respectively.

While a content of the electroluminescent material in the light-emitting layer varies according to the inorganic system or the organic system, in the case of the inorganic system, from the viewpoints of balance between light emission properties and economy and the like, in general, the content is preferably in the range of 20 to 900 parts by mass, more preferably 30 to 700 parts by mass, and still more preferably 40 to 500 parts by mass based on 100 parts by mass of a matrix resin as described below.

(Matrix Resin)

Examples of the matrix resin contained in the light-emitting composition include polyesters such as polyethylene terephthalate, polybutylene terephthalate, and polyester-based thermoplastic elastomers; polyurethane and polyurethane-based thermoplastic elastomers; polystyrene and polystyrene-based thermoplastic elastomers; polyvinyl chloride; polyolefins such as polypropylene, and polyolefin-based thermoplastic elastomers; silicone based resins; acrylic resins; and acrylic urethane resins. Among these materials, those having tackiness at ambient temperature are preferred. Using a resin having tackiness at ambient temperature, it is possible to bond the light-emitting layer to the electrode or the dielectric layer on application of pressure. As the resin having tackiness, acrylic resins are preferred.

Examples of acrylic resins include copolymers of a (meth)acrylic ester having from 1 to 20 carbon atoms in alkyl group and a monomer optionally having a functional group such as a carboxyl group and other monomer, namely (meth)acrylic ester copolymers.

Here, examples of the (meth)acrylic ester having from 1 to 20 carbon atoms in alkyl group include methyl (meth)acrylate, ethyl (meth)acrylate, propyl (meth)acrylate, butyl (meth)acrylate, pentyl (meth)acrylate, hexyl (meth)acrylate, cyclohexyl (meth)acrylate, 2-ethylhexyl (meth)acrylate, isooctyl (meth)acrylate, decyl (meth)acrylate, dodecyl (meth)acrylate, myristyl (meth)acrylate, palmityl (meth)acrylate, stearyl (meth)acrylate. These materials may be used alone, or two or more may be used in combination.

A weight average molecular weight of the (meth)acrylic ester copolymer is preferably 300,000 or more, and more preferably 400,000 to 1,000,000.

To the light-emitting composition, additive such as a crosslinking agent, an antioxidant, an ultraviolet absorbing agent, an infrared absorbing agent, and a pigment may be optionally added.

A coating method of the light-emitting composition is not particularly limited, and a conventionally known method such as knife coating, roll coating, bar coating, blade coating, die coating, and gravure coating may be applied.

A thickness of the light-emitting layer obtained in this way is generally 0.1 to 100 µm, preferably 5 to 90 µm, and more preferably 20 to 80 µm, from the viewpoints of a luminance of the light-emitting sheet and laminating properties with respect to other layer.

[Dielectric Layer]

In the light-emitting sheet of the present invention, a dielectric layer can be disposed between the first electrode and the light-emitting layer and/or between the light-emitting layer and the second electrode.

As a material for forming this dielectric layer, materials having a high dielectric constant are preferable. Examples thereof include inorganic materials such as $SiO_2$, $BaTiO_3$, SIGN, $Al_2O_3$, $TiO_2$, $Si_3N_4$, SiAlON, $Y_2O_3$, $Sm_2O_3$, $Ta_2O_5$, $BaTa_2O_3$, $PbNb_2O_3$, $Sr(Zr,Ti)O_3$, $SrTiO_3$, $PbTiO_3$, $HfO_3$, and Sb-containing $SnO_2$ (ATO); and organic materials such as polyethylene, polypropylene, polystyrene, epoxy resins, and cyanoacetyl cellulose. These materials may be used alone, or two or more thereof may be used in combination.

In the case where the dielectric layer is present between the light-emitting layer and the second electrode, the dielectric layer is required to be transparent. Therefore, among the above materials, inorganic materials such as $SiO_2$, $Al_2O_3$, $Si_3N_4$, $Y_2O_3$, $Ta_2O_5$, $BaTa_2O_3$, $SrTiO_3$, and $PbTiO_3$ are preferred. In the case where the dielectric layer is present between the first electrode and the light-emitting layer, it is not particularly needed that the dielectric layer is transparent.

The dielectric layer can be, for example, formed by coating a dispersion obtained by uniformly dispersing the material for forming a dielectric layer in a suitable binder according to a conventionally known coating method such as spraying, knife coating, roll coating, bar coating, blade coating, die coating, and gravure coating, or by using an extruder. Although the binder is not particularly limited, for example, the same materials as those in the above matrix resin of the light-emitting composition can be used. It is noted that in the case of the organic material, it is possible to coat the material without using a binder.

In the case of driving the light-emitting sheet of the present invention with an alternating current, when an electrical conductivity of the light-emitting layer is too high so that it is difficult to apply a sufficient voltage to the light-emitting layer, or when dielectric breakdown may be occurred due to an over current, the dielectric layer exhibits an effect for controlling such a matter. From the viewpoint of exhibiting the above effect, in general, a thickness of the dielectric layer is preferably 0.1 to 50 µm, and more preferably 10 to 50 µm.

<Installation of Short Circuit Preventing Member>

In the light-emitting sheet of the present invention, a short circuit preventing member composed of an insulator is arranged on a periphery of the light-emitting layer in such way that a part of the member is projected from the light-emitting layer.

(Short Circuit Preventing Member)

The short circuit preventing member is not particularly limited as far as a used material has insulating property (hereinafter abbreviated as "insulating material"). Examples thereof include inorganic materials such as $Y_2O_3$, $Al_2O_3$, $Si_3N_4$, $Ta_2O_5$, $PbTiO_3$, $BaTa_2O_6$, $SrTiO_3$, and mica; and various organic polymer materials including polyester based resins such as polyethylene terephthalate and polyethylene naphthalate, cyanoethyl cellulose based resins, polyolefin based resins such as polyethylene and polypropylene, polystyrene based resins, silicone resins, epoxy resins, fluorine resins, acrylic resins, polyimide based resins, and phenol resins.

As the short circuit preventing member, a sheet made of the above insulating material may be used; or a pressure sensitive adhesive tape which has a base sheet composed of an insulating material such as the polyester based resin or polyolefin based resin, and an insulating pressure sensitive adhesive layer thereon may be preferably used. As a pressure sensitive adhesive for forming the pressure sensitive adhesive layer having insulating property, known pressure sensitive adhesives such as acrylic pressure sensitive adhesives, silicone based pressure sensitive adhesives and rubber based pressure sensitive adhesives which are free from electrically conductive materials can be used. Also, a thickness of the pressure sensitive adhesive tape is preferably 10 to 500 µm.

A volume resistivity of the short circuit preventing member is preferably $10^{11}$ Ω·cm or more, and more preferably $10^{12}$ Ω·cm or more. The volume resistivity is a value determined by a method described in the Examples.

The short circuit preventing member may be arranged around the periphery of the light-emitting layer. Alternatively as described below, the short circuit preventing member may be arranged on "a part" of the periphery of the light-emitting layer under a condition that in a sectional shape of the light-emitting sheet, a non-conductive section is formed on the periphery of the electrode disposed on or under the periphery of the light-emitting layer in which the short circuit preventing member is not arranged. The term "arranged" includes not only a state in which the short circuit preventing member is inserted into the light-emitting layer, but a state in which the short circuit preventing member is sandwiched between the light-emitting layer and the electrode, and in the case where the short circuit preventing member is a pressure sensitive adhesive tape, a state in which the short circuit preventing member is laminated to the electrode while being sandwiched between the light-emitting layer and the electrode. It is noted that in the case where the short circuit preventing member is sandwiched between the light-emitting layer and the electrode, the short circuit preventing member may be arranged between the light-emitting layer and the first electrode or between the light-emitting layer and the second electrode, or may be arranged between the light-emitting layer and the first electrode and between the light-emitting layer and the second electrode.

It is preferred that the short circuit preventing member is provided in such a manner as to use a pressure sensitive adhesive tape as the short circuit preventing member and bond it to the electrode. It is simple and easy.

Here, the phrase "the short circuit preventing member is arranged around the periphery of the light-emitting layer" includes, in addition to a state in which the short circuit preventing member surrounds the entire periphery of the light-emitting layer, as seen from a vertical direction to the plane of the light-emitting sheet, a state the short circuit preventing member which is projected from the light-emitting layer apparently surrounds the light-emitting layer. As the state in which the short circuit preventing member apparently surrounds the light-emitting layer, for example in the case of a light-emitting sheet of a regular square, a state in which two sides of four sides of the short circuit preventing member are formed between the light-emitting layer and the first electrode, and remaining two sides are formed between the light-emitting layer and the second electrode may be exemplified.

A length of the projected site of the short circuit preventing member from the light-emitting layer is preferably 1 to 15 mm, and more preferably 1.5 to 12 mm. By projecting the short circuit preventing member from the light-emitting layer to this extent, it is possible to make a creepage distance between the first electrode and the second electrode sufficient for preventing the generation of a short circuit. In the case of arranging a short circuit preventing member, the creepage distance is the shortest distance when at an any point of the outer periphery of the light-emitting sheet, a distance between the first electrode and the second electrode is measured along the surface of the light-emitting layer and the short circuit preventing member (in the case where the light-emitting sheet has a dielectric layer, the surface of the dielectric layer is also included), and for example, in FIG. 5, the creepage distance is expressed by a total distance of three arrows. A minimum value of the creepage distance measured in this way is preferably 2 mm or more, and preferably 2.5 mm or more. Although an upper limit of the minimum value of the creepage distance is not particularly limited, it is generally about 100 mm.

As an example of the thus constituted light emitting sheet of the present invention, a light emitting sheet A of a quadrangular shape is shown in FIGS. 4 and 5. As shown in FIG. 5, in the light emitting sheet A, a light emitting layer 4 is sandwiched between a first electrode base material 1 and a second electrode base material 3, and a short circuit preventing member 2 and a short circuit preventing member 2' are arranged (laminated) on the periphery of the light emitting layer. As shown in FIGS. 4 and 5, in the light emitting sheet A, the short circuit preventing member 2 is arranged in such a way that it is projected from the light emitting layer on three sides of the light emitting sheet, and the short circuit preventing member 2' is projected from the light emitting layer on the remaining one side, and therefore, when seen from a vertical direction to the plane of the light emitting sheet, the short circuit preventing member which is projected from the light emitting layer seemingly makes a round of the light emitting layer.

In the light emitting sheet of the present invention, in the case where the short circuit preventing member is arranged on a part of the periphery of the light emitting layer in such a way that "a part" of the member is projected from the light emitting layer, a non-conductive section is formed on the periphery of the electrode disposed on or under the periphery of the light-emitting layer in which the short circuit preventing member is not arranged, or the short circuit preventing member is not arranged in such a way that it is projected from the light emitting layer. An example of such a light emitting sheet is explained by reference to FIGS. 6 to 12. In a light emitting sheet F' in which short circuit preventing members 8 and 8' are arranged linearly along a vertical direction of each electrode of a first electrode base material 6 and a second electrode base material 7, by cutting the first electrode and/or the second electrode along a lateral direction in which all of the short circuit preventing members 8 and 8' are not arranged. Then, non-conductive sections 12 and 12' being electrically non-connected from a circuit for applying a voltage to the light emitting sheet (hereinafter referred to simply as "electrically non-conductive state") are formed. When the obtained light-emitting sheet is seen from a vertical direction to the plane of the light emitting sheet, the short circuit preventing members and the non-conductive sections apparently surrounds the light-emitting layer.

In the case of both of the first electrode and the second electrode are respectively projected from the same edge of the light-emitting layer when the short circuit preventing member is arranged in such a way that the member is projected from the light-emitting layer, the effect of the invention might be deteriorated. Therefore it is preferred that an end of either one of the electrodes located at the top and bottom of the periphery of the light emitting layer in which the short circuit preventing member is disposed, as shown in FIG. 5, 10, 17 is not projected by 8 mm or more from the light emitting layer. It is more preferred that it is not projected by 5 mm or more, still more preferred that it is substantially not projected from the light emitting layer.

(Cutting Condition of Electrode)

Although a method of cutting the electrode is not particularly limited to, it is preferred to use a laser beam machine because of ease-to-use. The laser beam machine is not particularly limited, examples thereof include a YAG laser, a CO2 laser, an excimer laser, and a femtosecond laser.

A laser output or a scanning rate may be appropriately regulated so as to form a non-conductive section. As a standard, for example, in the case of cutting the electrode from the side of electrode substrate (see FIG. 12), it is generally preferred that a laser output is 30 to 80 W and a scanning rate is 350 to 700 mm/s when the thickness of the electrode substrate is in the range of 50 to 100 µm.

A cutting position of the electrode may be located inside the end of the light-emitting layer. However, in order to prevent a light-emitting area being excessively small, the cutting position from the end of the electrode is preferably 2 to 10 mm, more preferably 3 to 8 mm, and still more preferably 4 to 6 mm. Also, a part of the light-emitting layer may be cut. It is noted that after cutting the electrode from the electrode side of the electrode substrate, the light-emitting layer and the electrode may be laminated.

From the viewpoint of preventing a short circuit, in general, a cutting line width is preferably 10 µm or more. However, a short circuit preventing performance does not alter even by widening the cutting line width more than necessary, but the light-emitting area becomes small. Therefore, the cutting line width is more preferably 10 to 200 µm, and still more preferably 20 to 180 µm.

Figure 12:
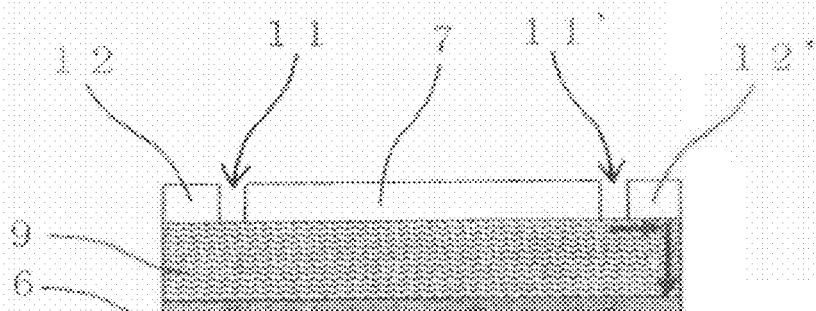
FIG. 12 is a vertically-sectional view of the light-emitting sheet F.

In addition, a minimum value of a creepage distance (a total distance of two arrows described in the light-emitting layer in FIG. 12) between an edge of the conductive section of the first electrode and an edge of the conductive section of the second electrode, both of which is electrically connected, is preferably 2 mm or more, and more preferably 2.5 mm or more by cutting of the electrode. Although an upper limit of the minimum value of the creepage distance is not particularly limited, it is in general about 100 mm. It is noted that the creepage distance is a value not taking into consideration a depth of the light-emitting layer cut together at cutting of the electrode.

[Producing Method of Light-Emitting Sheet]

An embodiment of the production of the light-emitting sheet of the present invention is not particularly limited, so any method may be adopted as far as a light-emitting sheet having the above constitution can be obtained.

An example of the method of producing the light-emitting sheet of the present invention include a method in which a first laminate and a second laminate are made by the following process (1) or (2), then the light-emitting layer side of the first laminate and the second electrode side of the second laminate, or the first electrode side of the first laminate and the light-emitting layer side of the second laminate are bonded each other.

(1) A process of forming a first electrode and a light-emitting layer on a first substrate in sequence to make a first laminate, and separately forming a second electrode on a second substrate to make a second laminate.

(2) A process of forming a first electrode on a first substrate to make a first laminate, and separately forming a second electrode and a light-emitting layer on a second substrate in sequence to make a second laminate.

In the above processes (1) and (2), timing of arranging the short circuit preventing member and cutting the electrode are not particularly limited. For example, in the process (1), the following methods (1A) and (1B) can be utilized.

(1A) A method of arranging (laminating) a short circuit preventing member on the first electrode formed on the first substrate, and subsequently forming a light-emitting layer in such a way that a part of the short circuit preventing member is projected from the light-emitting layer, to make the first laminate, in the case that a site of the short circuit preventing member arranged on the first electrode is not projected from the light-emitting layer, forming at least the second electrode on the second substrate, and then arranging (laminating) the short circuit preventing member on the second electrode on the second substrate in the above site.

(1B) A method of arranging (laminating) a short circuit preventing member on the first electrode formed on the first substrate, and subsequently forming a light-emitting layer in such a way that a part of the short circuit preventing member is projected from the light-emitting layer, to make the first laminate, in the case that a site of the short circuit preventing member arranged on the first electrode is not projected from the light-emitting layer, forming at least the second electrode on the second substrate, and then cutting the second electrode on the second substrate located in the above site to provide a non-conductive section.

In the process (2), for example, the following methods (2A) and (2B) can be utilized.

(2A) A method of arranging (laminating) a short circuit preventing member on the second electrode formed on the second substrate, and subsequently forming a light-emitting layer in such a way that a part of the short circuit preventing member is projected from the light-emitting layer, to make the second laminate, in the case that a site of the short circuit preventing member arranged on the second electrode is not projected from the light-emitting layer, forming at least the first electrode on the first substrate, and then arranging laminating) the short circuit preventing member on the first electrode on the first substrate located in the above site.

(2B) A method of arranging (laminating) a short circuit preventing member on the second electrode formed on the second substrate, and subsequently forming a light-emitting layer in such a way that a part of the short circuit preventing member is projected from the light-emitting layer, to make the second laminate, in the case that a site of the short circuit preventing member arranged on the second electrode is not projected from the light-emitting layer, forming at least the first electrode on the first substrate, and then cutting the first electrode on the first substrate located in the above site to provide a non-conductive section.

Hereinafter, the constitutions of the first laminate and the second laminate are conveniently expressed with symbols as follows. That is, the first substrate and the second substrate are expressed by "1" and 2", respectively. And the first electrode and the second electrode are expressed by "$E^1$" and "$E^2$", respectively. At the same time, the light-emitting layer is expressed by "L", and the dielectric layer as described below is expressed by "D" or "D'". In such case, the method through the above process (1), a laminate having a constitution of $1$-$E^1$-L is obtained as the first laminate, and a laminate having a constitution of $2$-$E^2$ is obtained as the second laminate. By bonding these first laminate and second laminate to each other with facing L and $E^2$ each other, a light-emitting sheet having a constitution of $1$-$E^1$-L-$E^2$-$2$ is obtained.

In the method through the above process (2), a laminate having a constitution of $1$-$E^1$ is obtained as the first laminate, and a laminate having a constitution of $2$-$E^2$-L is obtained as the second laminate. By bonding these first laminate and second laminate with facing $E^1$ and L each other, a light-emitting sheet having a constitution of $1$-$E^1$-L-$E^2$-$2$ is obtained.

Further, making the first laminate and the second layer by any one of the following processes (3) to (12) and bonding the dielectric layer side, light-emitting layer side or first electrode side of the first laminate and the second electrode side, light-emitting layer side or dielectric layer side of the second laminate to each other, a light-emitting sheet having a dielectric layer between the first electrode or the second electrode and the light-emitting layer can also be obtained. However, the present invention is not particularly limited thereto.

(3) A process of forming a first electrode, a dielectric layer, and a light-emitting layer in this order on a first substrate to make a first laminate, and separately forming a second electrode on a second substrate to make a second laminate.

(4) A process of forming a first electrode and a dielectric layer in sequence on a first substrate to make a first laminate, and separately forming a second electrode and a light-emitting layer in sequence on a second substrate to make a second laminate.

(5) A process of forming a first electrode on a first substrate to make a first laminate, and separately forming a second electrode, a light-emitting layer, and a dielectric layer in this order on a second substrate to make a second laminate.

(6) A process of forming a first electrode, a light-emitting layer, and a dielectric layer in this order on a first substrate to make a first laminate, and separately forming a second electrode on a second substrate to make a second laminate.

(7) A process of forming a first electrode and a light-emitting layer in sequence on a first substrate to make a first laminate, and separately forming a second electrode and a dielectric layer in sequence on a second substrate to make a second laminate.

(8) A process of forming a first electrode on a first substrate to make a first laminate, and separately forming a second electrode, a dielectric layer, and a light-emitting layer in this order on a second substrate to make a second laminate.

(9) A process of forming a first electrode, a dielectric layer, a light-emitting layer, and a dielectric layer in this order on a first substrate to make a first laminate, and separately forming a second electrode on a second substrate to make a second laminate.

(10) A process of forming a first electrode, a dielectric layer, and a light-emitting layer in this order on a first substrate to make a first laminate, and separately forming a second electrode and a dielectric layer in sequence on a second substrate to make a second laminate.

(11) A process of forming a first electrode and a dielectric layer in sequence on a first substrate to make a first laminate, and separately forming a second electrode, a dielectric layer, and a light-emitting layer in this order on a second substrate to make a second laminate.

(12) A process of forming a first electrode on a first substrate to make a first laminate, and separately forming a second electrode, a dielectric layer, a light-emitting layer, and a dielectric layer in this order on a second substrate to make a second laminate.

It is noted that in the above processes (3) to (12), timing of arranging the short circuit preventing member and cutting of the electrode are not particularly limited. In addition, in the above processes (9) to (12), the dielectric layer on the first electrode side and the dielectric layer on the second electrode side may be the same as or different from each other.

In the method through each of the above processes (1) to (12), the constitution of the first laminate, the constitution of the second laminate, and the constitution of the light-emitting sheet are shown in Table 1.

TABLE 1

| Process | Constitution of first laminate | Constitution of second laminate | Constitution of light-emitting sheet |
|---|---|---|---|
| (1) | 1-$E^1$-L | 2-$E^2$ | 1-$E^1$-L-$E^2$-2 |
| (2) | 1-$E^1$ | 2-$E^2$-L | 1-$E^1$-L-$E^2$-2 |
| (3) | 1-$E^1$-D-L | 2-$E^2$ | 1-$E^1$-D-L-$E^2$-2 |
| (4) | 1-$E^1$-D | 2-$E^2$-L | 1-$E^1$-D-L-$E^2$-2 |
| (5) | 1-$E^1$ | 2-$E^2$-L-D | 1-$E^1$-L-D-$E^2$-2 |
| (6) | 1-$E^1$-L-D | 2-$E^2$ | 1-$E^1$-L-D-$E^2$-2 |
| (7) | 1-$E^1$-L | 2-$E^2$-D | 1-$E^1$-L-D-$E^2$-2 |
| (8) | 1-$E^1$ | 2-$E^2$-D-L | 1-$E^1$-L-D-$E^2$-2 |
| (9) | 1-$E^1$-D-L-D' | 2-$E^2$ | 1-$E^1$-D-L-D'-$E^2$-2 |
| (10) | 1-$E^1$-D-L | 2-$E^2$-D' | 1-$E^1$-D-L-D'-$E^2$-2 |
| (11) | 1-$E^1$-D | 2-$E^2$-D'-L | 1-$E^1$-D-L-D'-$E^2$-2 |
| (12) | 1-$E^1$ | 2-$E^2$-D'-L-D | 1-$E^1$-D-L-D'-$E^2$-2 |

From the viewpoint of improving the productivity of the light-emitting sheet of the present invention, the light-emitting sheet may be produced by a roll-to-roll process. The production of the light-emitting sheet of the present invention by the roll-to-roll process is a method in which unwinding a long electrode substrate wound-up into a roll, then arrangement of a short circuit preventing member, formation of a non-conductive section, formation of a light-emitting layer, and bonding to an electrode substrate, and optionally formation of a dielectric layer are performed, followed by wound-up into a roll. The obtained light-emitting sheet can be used in any application by cutting into a desired size.

In the case of adopting the roll-to-roll process, (a) a short circuit preventing member composed of an insulator is arranged on the peripheries of two sides of a light-emitting layer along a flow direction (vertical direction) of the light-emitting layer in such a way that a part of the member is projected from the light-emitting layer, and then a first electrode and/or a second electrode is cut along a width direction (lateral direction) to form a non-conductive section being electrically disconnected. Alternatively, (b) a short circuit preventing member composed of an insulator is arranged on the periphery of one side of a light-emitting layer along a flow direction (vertical direction) of the light-emitting layer in such a way that a part of the member is projected from the light-emitting layer, and an electrode disposed on or under the periphery of another side of the light-emitting layer is cut to form a non-conductive section being electrically disconnected, and further a first electrode and/or a second electrode is cut along a width direction to form a non-conductive section being electrically disconnected. It is noted that timing of arranging the short circuit preventing member and forming the non-conductive section are not particularly limited to, and it is possible to perform at an optional stage, respectively.

The method of producing the light-emitting sheet of the present invention by the roll-to-roll process is explained more specifically below, but it should not be construed that the present invention is limited thereto.

(Roll-to-Roll Process (I))

(i) Each of the long first electrode substrate and second electrode substrate wound-up into a roll is unwound, and the short circuit preventing member is arranged on the electrode surface along a flow direction (vertical direction) of each of the electrode substrates.

(ii) The light-emitting layer is formed on the first electrode surface of the first electrode substrate (or the second electrode surface of the second electrode substrate) in such a way that apart of the short circuit preventing member is projected from the light-emitting layer.

(iii) The second electrode substrate (or the first electrode substrate) is laminated onto the light-emitting layer to form a long light-emitting sheet.

(iv) The first electrode and/or the second electrode is cut at an any position along a width direction of the long light-emitting sheet to form a non-conductive part. In this case, considering an end of the electrode in the size of the desired light-emitting sheet, the electrode is cut so as to preferably remain 2 to 10 mm, more preferably remain 3 to 8 mm, and still more preferably remain 4 to 6 mm from the end of the electrode.

(v) The resulting light-emitting sheet is wound-up into a roll.

(Roll-to-Roll Process (II))

(i) The long first electrode substrate wound-up into a roll is unwound, and one side of the first electrode substrate along a flow direction (vertical direction) is cut to form a non-conductive section, followed by wound-up into a roll. It is noted that in this case, from the viewpoint of performing the works in the following (iii) with ease, it is preferred to cut the electrode so as to remain a part of the substrate.

(ii) The long first electrode substrate and/or second electrode substrate wound-up into a roll is unwound, and the short circuit preventing member is arranged on one side in which non-conductive section is not formed in a flow direction of the electrode.

(iii) The light-emitting layer is formed on the first electrode surface of the first electrode substrate (or the second electrode surface of the second electrode substrate) in such a way that apart of the short circuit preventing member is projected from the light-emitting layer.

(iv) The second electrode substrate (or the first electrode substrate) is laminated on the light-emitting layer to form a long light-emitting sheet.

(v) The first electrode and/or the second electrode is cut at an any position along a width direction of the long light-emitting sheet to form a non-conductive part. In this case, considering an end of the electrode in the size of the desired light-emitting sheet, the electrode is cut so as to preferably remain 2 to 10 mm, more preferably remain 3 to 8 mm, and still more preferably remain 4 to 6 mm from the end of the electrode.

(vi) The resulting light-emitting sheet is wound-up into a roll.

In the roll-to-roll process, the above stages may be continuously performed, or a method in which the light-emitting sheet is once wound-up into a roll at each stage and then again unwound may be adopted. Furthermore, a dielectric layer may be formed between each electrode and the light-emitting layer as necessary. Also, for the same reasons as described above, a cutting width at cutting the electrode is preferably 10 to 200 μm, and more preferably 20 to 180 μm.

The obtained light-emitting sheet as stated above is suppressed with respect to dielectric breakdown at the time of applying a voltage and does not cause failures such as a short circuit. Therefore, it is endurable against the use over a long period of time and excellent in reliability as compared with conventional light-emitting sheets.

EXAMPLES

Next, the present invention will be described in more detail with reference to Examples based on the drawings, but it should be construed that the present invention is not limited at all by these Examples.

It is noted that a weight average molecular weight of an acrylic ester copolymer in the light-emitting layer used in each of the Examples is a value which is determined by gel permeation chromatography based on monodispersed polystyrene, and calculated in terms of polystyrene standard. In addition, a surface resistivity of each of a first electrode and a second electrode, a transmittance of a second electrode substrate, and a volume resistivity of a short circuit preventing member (pressure sensitive adhesive tape) were measured in the following manners.

[Measurement Method of Surface Resistivity of Each of First Electrode and Second Electrode]

A first electrode substrate and a second electrode substrate were allowed to stand for 24 hours under a condition at 23° C. and a relative humidity of 50% and then measured for a surface resistivity under the same condition by using a surface resistivity meter (a trade name: R-127004, manufactured by ADVANTEST CORPORATION).

[Measurement Method of Transmittance of Second Electrode Substrate]

A transmittance of light having a wavelength of 550 nm was measured from the electrode side by using an ultraviolet-visible-near infrared spectrophotometer (a trade name: UV-3101PC, manufactured by Shimadzu Corporation).

[Measurement Method of Volume Resistivity of Short Circuit Preventing Member (Pressure Sensitive Adhesive Tape)]

A short circuit preventing member was allowed to stand for 24 hours under a condition at 23° C. and a relative humidity of 50% and then measured for a volume resistivity under the same condition by using a digital electrometer (a trade name: R8252, manufactured by ADVANTEST CORPORATION).

A first substrate, a first electrode, a second substrate, a second electrode, a laminator, and a laser beam machine used in each of the Examples are as follows.

First substrate: Polyethylene terephthalate film (thickness: 50 µm)

First electrode: Aluminum foil (thickness: 12 µm)

A laminate having the first electrode laminated on the first substrate is hereinafter referred to as "first electrode substrate". In each of the Examples, a trade name "ALPET (trademark) 12×50" (manufactured by Asia Alumi Co., Ltd.) was used as the first electrode substrate. A surface resistivity of the first electrode was found to be 0.5 Ω/□.

Second substrate: Polyethylene terephthalate (thickness: 75 µm)

Second electrode: Indium tin oxide (ITO, thickness: 100 nm)

A laminate having the second electrode laminated on the second substrate is hereinafter referred to as "second electrode substrate". In each of the Examples, a product name "MetalForce R-IT(E12)" (manufactured by Nakai Industry Co., Ltd.) was used as the second electrode substrate. A surface resistivity of the second electrode was found to be $10^2 Ω/□$, and a transmittance of light having a wavelength of 550 nm from the second electrode substrate was found to be 89%.

Laminator: A trade name "Excelam 355Q" (manufactured by GMP Co., Ltd.)

Laser beam machine: A trade name "$CO_2$ LASER MARKER LP-ADP40" (manufactured by Sunx Limited)

A light-emitting layer and a dielectric layer used in each of the Examples were produced in the following manners.

(Light Emitting Layer)

A mixture of 100 parts by mass of an acrylic ester copolymer composed of n-butyl acrylate and acrylic acid (n-butyl acrylate/acrylic acid=90/10 (mass ratio), weight average molecular weight: 800,000) as a matrix resin, 300 parts by mass of ZnS/Cu based fluorescent material (a product name: GG25 BlueGreen, manufactured by Osram Sylvania Inc.) as an electroluminescent material, 2 parts by mass of a polyisocyanate based crosslinking agent (a product name: Oribain (trademark) BHS8515, manufactured by Toyo Ink Co., Ltd., solids content: 37.5% by mass), and 500 parts by mass of toluene as a solvent was thoroughly stirred to prepare a coating solution of light-emitting composition.

The obtained coating solution was applied to release surface of a first release film (a product name: SP-PET3811, manufactured by Lintec Corporation; referred to as "first release film" in each of the Examples) with use of a knife coater so as to achieve a dry thickness of 55 µm, and then heated and dried at 100° C. for 2 minutes to form a light-emitting layer; and a second release film (a product name: SP-PET3801, manufactured by Lintec Corporation; referred to as "second release film" in each of the Examples) was laminated onto the surface of the light-emitting layer, thereby obtaining a light-emitting layer having the release film provided on the both surfaces thereof (referred to as "light-emitting layer-containing sheet" in each of the Examples).

(Dielectric Layer)

A mixture of 100 parts by mass of an acrylic ester copolymer composed of n-butyl acrylate and acrylic acid (n-butyl acrylate/acrylic acid=90/10 (mass ratio), weight average molecular weight: 800,000), 100 parts by mass of titanium oxide (a product name: SZ Color #7030 White, manufactured by Dainichiseika Color & Chemicals Mfg. Co., Ltd.), and 300 parts by mass of toluene as a solvent was thoroughly stirred, applied to a release film (a product name: SP-PET3811, manufactured by Lintec Corporation) so as to achieve a dry thickness of 10 µm, and then dried at 100° C. for 2 minutes, thereby forming a dielectric layer on the release film (referred to as "dielectric layer-containing sheet" in each of the Examples).

A dielectric strength test and a short circuit test of the light-emitting sheet obtained in each of the Examples were performed in the following manners.

[Dielectric Strength Test]

With respect to the light-emitting sheet obtained in each of the Examples, a voltage at which dielectric breakdown occurred was measured by using a dielectric strength analyzer (a product name: AC dielectric strength tester 7220, manufactured by KEISOKU GIKEN Co., Ltd.) and increasing an applied voltage in the range of 0 V to 1,000 V for one minute at a current of 10 mA. The larger the voltage at which the dielectric breakdown occurs, the more excellent the dielectric strength properties are.

[Short Circuit Test]

The presence or absence of short circuit at the end of a light-emitting sheet when the light-emitting sheet obtained in each of the Examples was driven at AC 200 V and 2,000 Hz was visually confirmed. It is noted that when a short circuit was generated, black spots were confirmed immediately after driving.

Example 1

Figure 1:
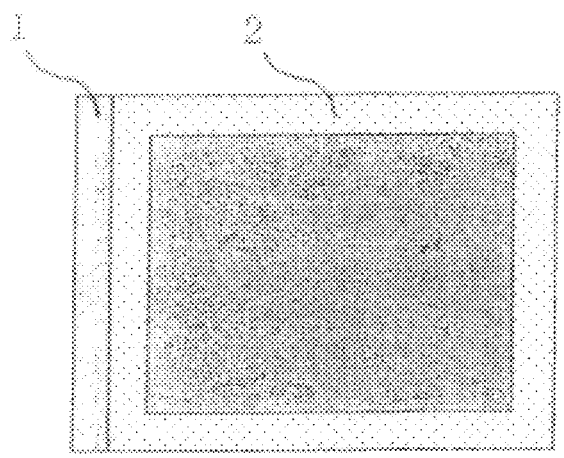
FIG. 1 is a diagram showing that a short circuit preventing member is laminated (arranged) around a first electrode of a first electrode substrate (laminate 1).

As shown in FIG. 1, on a first electrode surface of a first electrode substrate 1 having a B4 size (364 mm wide by 257 mm length), a pressure sensitive adhesive tape [pressure sensitive adhesive tape (width: 10 mm) having a 24 µm-thick pressure sensitive adhesive layer provided on a 16 µm-thick polyethylene terephthalate film; a product name: FR1225-16, manufactured by Lintec Corporation, volume resistivity: $10^{18}$ Ω·cm] was laminated as a short circuit preventing member 2 along the framework of the first electrode surface by using the laminator, thereby obtaining a laminate 1. Here, each two of tapes having a length of 339 mm and a length of 237 mm, respectively were used as the pressure sensitive adhesive tape, and laminated along the framework as shown in FIG. 1. It is noted that the shortest distance of from a left end of the laminate 1 to a left end of the short circuit preventing member 2 (a width of a portion where the pressure sensitive adhesive tape was not laminated) was made 25 mm.

Figure 2:
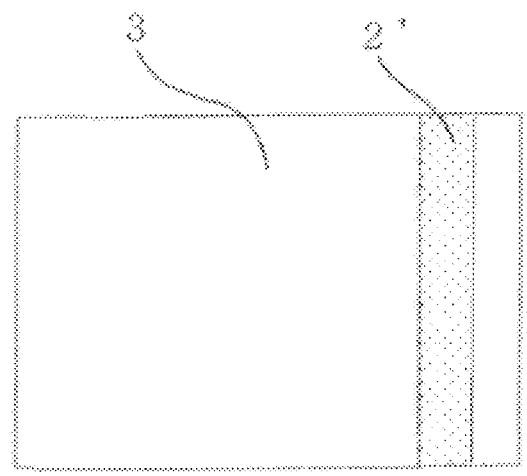
FIG. 2 is a diagram showing that a short circuit preventing member is laminated (arranged) linearly along a vertical direction on the right side of a second electrode of a second electrode substrate (laminate 2).

On the other hand, as shown in FIG. 2, on a second electrode surface of a second electrode substrate 3 having a size of 247 mm length by 364 mm wide, a pressure sensitive adhesive tape (a product name: FR1225-16, manufactured by Lintec Corporation, width: 10 mm (as described above)) was laminated as a short circuit preventing member 2' linearly by using the laminator, thereby forming a laminate 2. It is noted that the shortest distance of from a right end of the laminate 2 to a right end of the short circuit preventing member 2' (a width of a portion where the pressure sensitive adhesive tape was not laminated) was made 25 mm.

Subsequently, as shown in FIG. 3, a light-emitting layer 4 was laminated on the first electrode surface of the laminate 1 by using the laminator in such a way that a part of the short circuit preventing member 2 was projected from the light-emitting layer, while removing the second release film of the light-emitting layer-containing sheet having a size of 247 mm length by 334 mm wide, thereby forming a laminate 3. In this case, a length of the portion projected from the light-emitting layer 4 of the short circuit preventing member 2 (projected section 5 of the short circuit preventing member) was made 5 mm (see FIG. 5).

Subsequently, as shown in FIG. 4, the laminate 2 and the laminate 3 were laminated by using the laminator in such a way that the second electrode surface of the laminate 2 was contacted with the light-emitting layer 4 of the laminate 3 and the short circuit preventing member 2' laminated on the laminate 2 was located on a right side, while removing the first release film of the light-emitting layer 4 in the laminate 3, thereby obtaining a light-emitting sheet A. In this case, the second electrode surface of the laminate 2 was allowed to cover the whole of the light-emitting layer 4 of the laminate 3, and also a length of the portion projected from the light-emitting layer 4 of the short circuit preventing member 2' laminated on the side of the laminate 2 (projected section 5' of short circuit preventing member) was made 5 mm (see FIG. 5). A minimum value of a creepage distance between the first electrode and the second electrode in this light-emitting sheet A (the minimum value of the creepage distance between the first electrode and the second electrode will be hereinafter referred to simply as "creepage distance") was calculated by the sum of a length of the projected section (5 mm), a thickness of the short circuit preventing member (0.040 mm), and a thickness of the light-emitting layer (0.055 mm) and found to be 5.095 mm. The creepage distance, the result of dielectric strength test and short circuit test of the obtained light-emitting sheet A are shown in Table 2.

Example 2

A light-emitting sheet B was obtained in the same manner as in Example 1, except that a pressure sensitive adhesive tape having a 24 μm-thick pressure sensitive adhesive layer provided on a 25 μm-thick polyethylene terephthalate film (a product name: FR1225-25, manufactured by Lintec Corporation; width: 10 mm, volume resistivity: $10^{18}$ Ω·cm) was used as the short circuit preventing members 2 and 2'. A creepage distance of this light-emitting sheet B was found to be 5.104 mm.

The creepage distance and the results of each test relating to the obtained light-emitting sheet B are shown in Table 2.

Example 3

A light-emitting sheet C was obtained in the same manner as that in Example 1, except that a pressure sensitive adhesive tape having a 24 μm-thick pressure sensitive adhesive layer provided on a 75 μm-thick polyethylene terephthalate film (a product name: FR1225-75, manufactured by Lintec Corporation; width: 10 mm, volume resistivity: $10^{18}$ Ω·cm) was used as the short circuit preventing members 2 and 2'. A creepage distance of this light-emitting sheet C was found to be 5.154 mm.

The creepage distance and the results of each test relating to the obtained light-emitting sheet C are shown in Table 2.

Example 4

A light-emitting sheet D was obtained in the same manner as that in Example 1, except that a length of each of the portions projected from the light-emitting layers of the short circuit preventing members 2 and 2' (projected sections 5 and 5' of short circuit preventing member) was made 10 mm. A creepage distance of this light-emitting sheet D was found to be 10.095 mm.

The creepage distance and the results of each test relating to the obtained light-emitting sheet D are shown in Table 2.

Example 5

A light-emitting sheet E was obtained in the same manner as that in Example 1, except that a length of each of the portions projected from the light-emitting layers of the short circuit preventing members 2 and 2' (projected sections 5 and 5' of short circuit preventing member) was made 2.5 mm. A creepage distance of this light-emitting sheet E was found to be 2.595 mm.

The creepage distance and the results of each test relating to the obtained light-emitting sheet E are shown in Table 2.

Example 6

As shown in FIG. 6, on a first electrode surface of a first electrode substrate 6 having a 24 size, a pressure sensitive adhesive tape (a product name: FR-1225-16, manufactured by Lintec Corporation, width: 10 mm (as described above)) was laminated as a short circuit preventing member 8 by using the laminator, thereby forming a laminate 4. It is noted that the shortest distance of from a left end of the laminate 4 to a left end of the short circuit preventing member 8 (a width of a portion where the pressure sensitive adhesive tape was not laminated) was made 25 mm.

Figure 7:
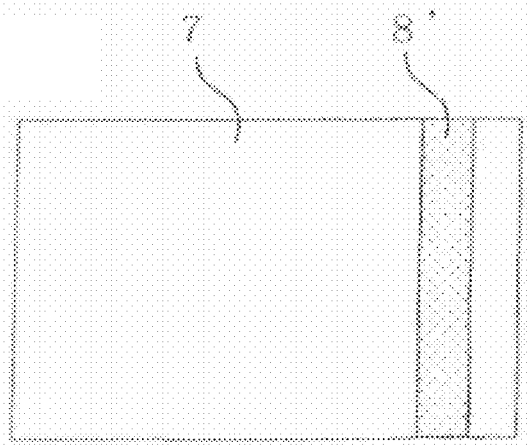
FIG. 7 is a diagram showing that a short circuit preventing member is laminated (arranged) linearly along a vertical direction of the right side of a second electrode of a second electrode substrate (laminate 5).

Also, as shown in FIG. 7, on a second electrode surface of a second electrode substrate 7 having a B4 size, a pressure sensitive adhesive tape (a product name: FR1225-16, a pressure sensitive adhesive tape manufactured by Lintec Corporation, width: 10 mm (as described above)) was laminated as a short circuit preventing member 8' by using the laminator, thereby forming a laminate 5. The shortest distance of from a right end of the laminate 5 to a right end of the short circuit preventing member 8' (a width of a portion where the pressure sensitive adhesive tape was not laminated) was made 25 mm.

Figure 8:
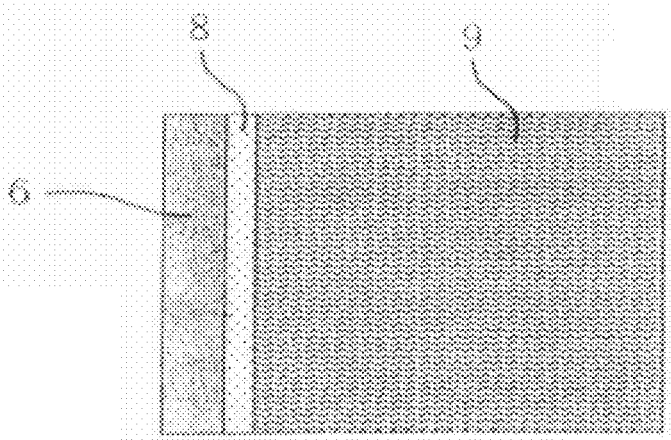
FIG. 8 is a diagram showing that a light-emitting layer is formed on the first electrode surface and the short circuit preventing member of the laminate 4 in such a way that a part of the short circuit preventing member is projected from the light-emitting layer (laminate 6).

Subsequently, as shown in FIG. 8, a light-emitting layer-containing sheet was laminated on the first electrode surface of the laminate 4 by using the laminator, while removing the second release film of the light-emitting layer-containing sheet having a size of 257 mm length by 334 mm wide, thereby forming a laminate 6 having a light-emitting layer 9 provided thereon. In this case, a length of the portion projected from the light-emitting layer 9 of the short circuit preventing member 8 (projected section 10 of short circuit preventing member) was made 5 mm (see FIG. 10).

Figure 9:
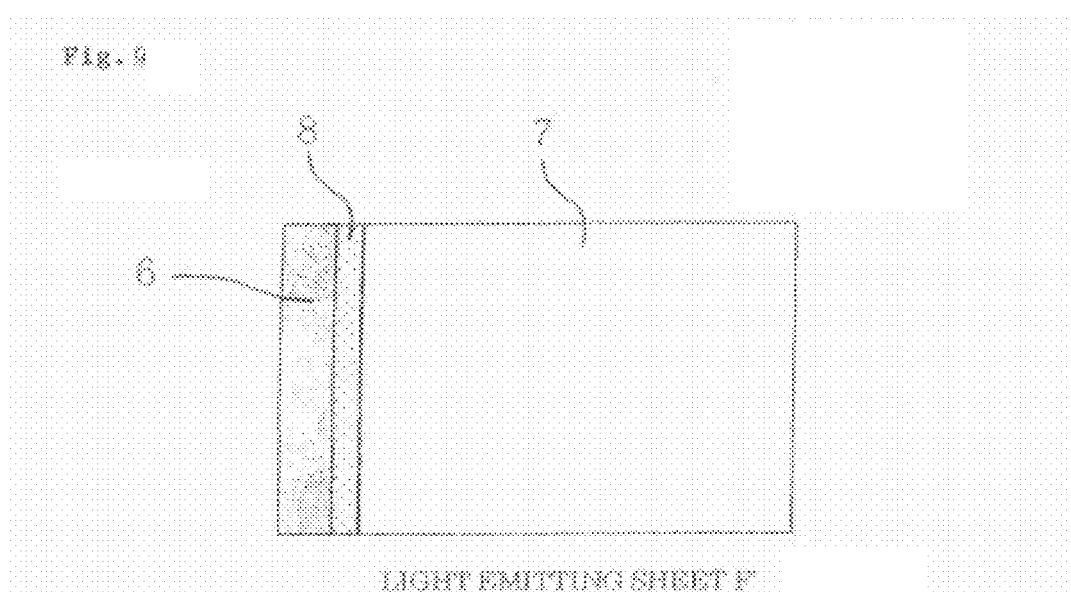
FIG. 9 is a diagram showing a light-emitting sheet F' having the laminate 5 bonded onto the laminate 6.
Figure 10:
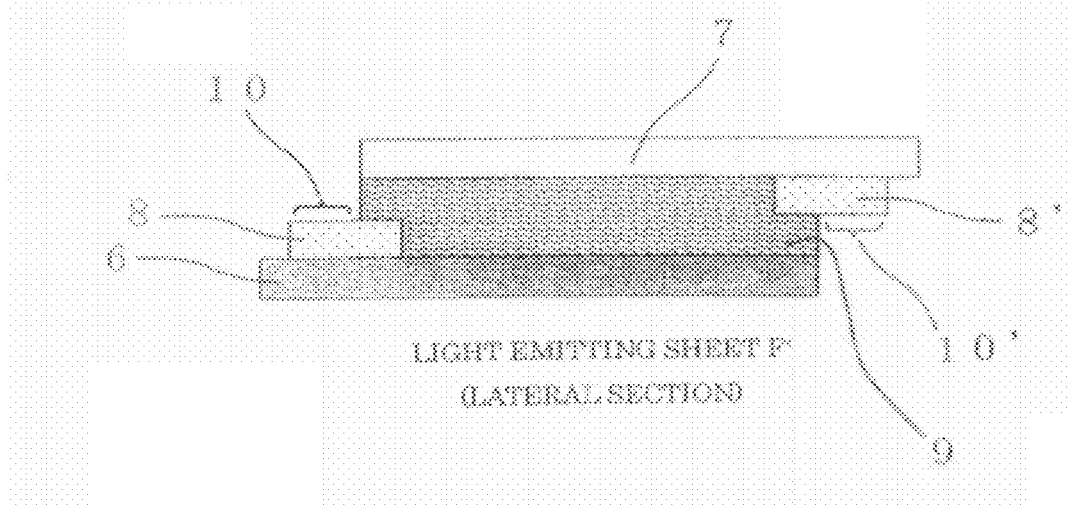
FIG. 10 is a lateral cross-sectional view of the light-emitting sheet F'.

Subsequently, as shown in FIG. 9, the laminate 5 and the laminate 6 were laminated by using the laminator in such a way that the second electrode surface of the laminate 5 was contacted with the light-emitting layer 9 of the laminate 6 and the laminate 5 and the short circuit preventing member 8' laminated on the laminate 5 was located on a right side, while removing the first release film of the light-emitting layer 9 in the laminate 6, thereby forming a light-emitting sheet F'. In this case, a length of the portion projected from the light-emitting layer 9 of the short circuit preventing member 8' laminated on the side of the laminate 5 (projected section 10' of short circuit preventing member) was made 5 mm (see FIG. 10).

Figure 11:
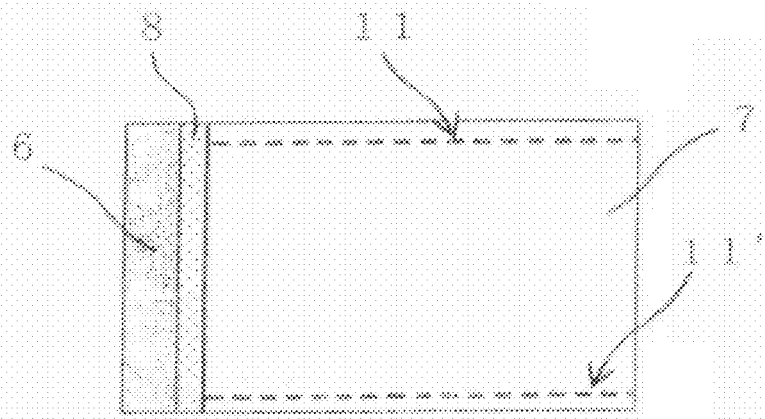
FIG. 11 is a diagram showing a light-emitting sheet F obtained by cutting a second electrode of the light-emitting sheet F' with a laser beam machine.

Subsequently, as shown in FIG. 11, positions of 5 mm from edges along the edges of the second electrode substrate 7 of the light-emitting sheet F' (laser cut sections 11 and 11') were cut by using a laser beam machine under a condition at a laser output of 45 W and a scanning rate of 500 mm/s to form non-conductive sections 12 and 12' shown in FIG. 12, thereby obtaining a light-emitting sheet F. It is noted that a width of each of the laser cut sections 11 and 11' was 143 µm, and a cut depth thereof was 76 µm. A creepage distance of this light-emitting sheet F was found to be 5.055 mm.

The creepage distance and the results of each test relating to the obtained light-emitting sheet F are shown in Table 2.

Example 7

A light-emitting sheet G was obtained in the same manner as that in Example 6, except that after laminating the short circuit preventing member 8 on the first electrode, a dielectric layer having the same shape and area as the light-emitting layer 9 was laminated on the first electrode surface by using a dielectric layer-containing sheet, the release film of the dielectric layer was subsequently removed, and then the light-emitting layer 9 was laminated by using the laminator in such a way that the light-emitting layer 9 overlapped the dielectric layer, while removing the second release film of the light-emitting layer-containing sheet (namely, the dielectric layer was provided between the first electrode and the light-emitting layer 9). A creepage distance of this light-emitting sheet G was found to be 5.065 mm.

The creepage distance and the results of each test relating to the obtained light-emitting sheet G are shown in Table 2.

Example 8

A first electrode substrate and a second electrode substrate each having dimensions with 300 mm width and 100 m length, and a light-emitting layer-containing sheet having a release sheet provided on both surfaces thereof and having dimensions with 270 mm width and 100 m length were prepared and wound-up into a roll, respectively.

Figure 13:
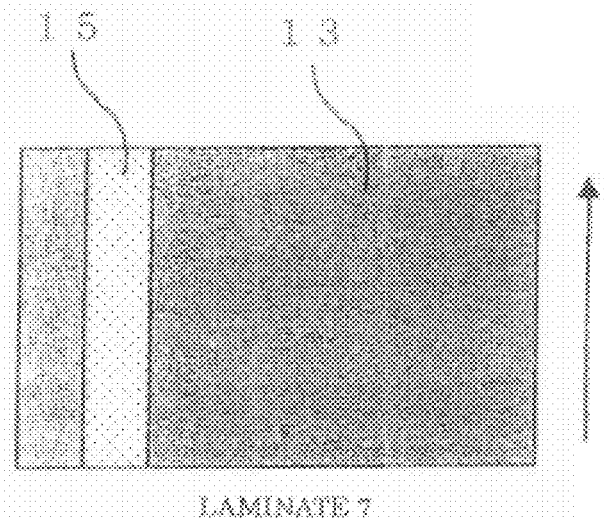
FIG. 13 is a diagram showing that a short circuit preventing member is laminated (arranged) linearly along a vertical direction on the left side of a first electrode of a first electrode substrate unwound from a roll to direction of arrow (laminate 7).

Then, as shown in FIG. 13, a pressure sensitive adhesive tape [a product name: FR1225-16, manufactured by Lintec Corporation, width: 10 mm (as described above)] was laminated as a short circuit preventing member 15 on the first electrode surface along a flow direction of the first electrode substrate (an arrow direction on a right side in FIG. 13) by using the laminator, while unwinding a first electrode substrate 13 from a roll, thereby forming a laminate 7, and the obtained laminate 7 was wound-up into a roll. It is noted that the shortest distance of from a left end of the laminate 7 to a left end of the short circuit preventing member 15 (a width of a portion where the pressure sensitive adhesive tape was not laminated) was made 25 mm.

Figure 14:
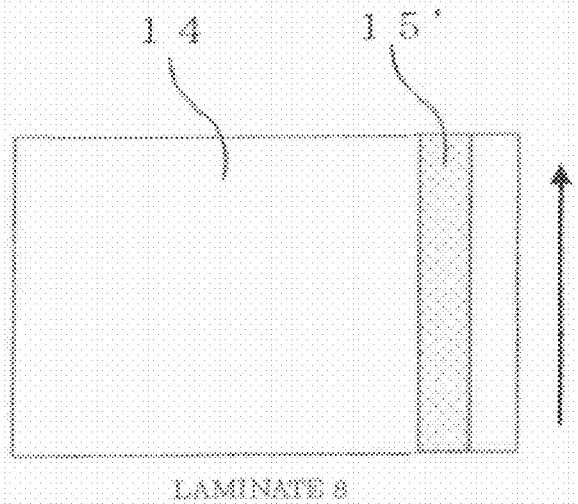
FIG. 14 is a diagram showing that a short circuit preventing member is laminated (arranged) linearly along a vertical direction on the right side of a second electrode of a second electrode substrate unwound from a roll (laminate 8).

As shown in FIG. 14, a pressure sensitive adhesive tape [a product name: FR-1225-16, manufactured by Lintec Corporation, width: 10 mm (as described above)] was similarly laminated as a short circuit preventing member 15' on the second electrode surface along a flow direction of the second electrode substrate, thereby forming a laminate 8, and the obtained laminate 8 was wound-up into a roll. It is noted that the shortest distance of from a right end of the laminate 8 to a right end of the short circuit preventing member 15' (a width of a portion where the pressure sensitive adhesive tape was not laminated) was made 25 mm.

Figure 15:
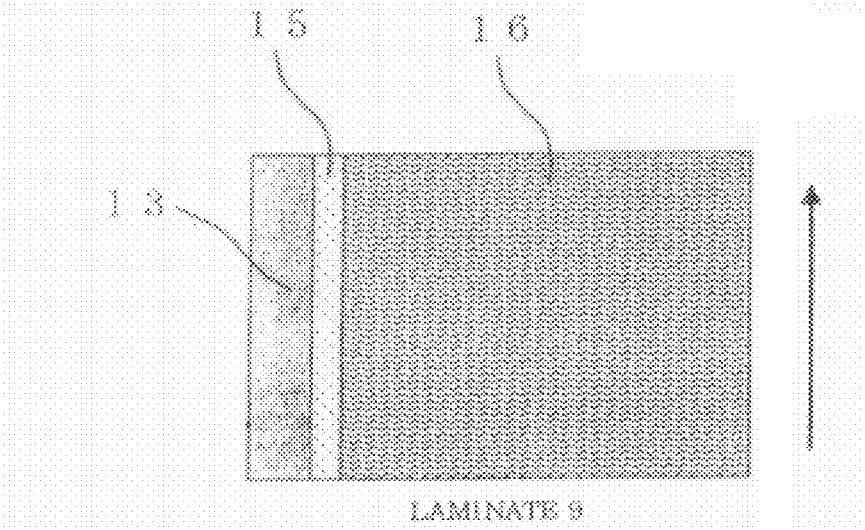
FIG. 15 is a diagram showing that a light-emitting layer is formed on the first electrode surface and the short circuit preventing member of the laminate 7 unwound from a roll such that apart of the short circuit preventing member is projected from the light-emitting layer (laminate 9).
Figure 17:
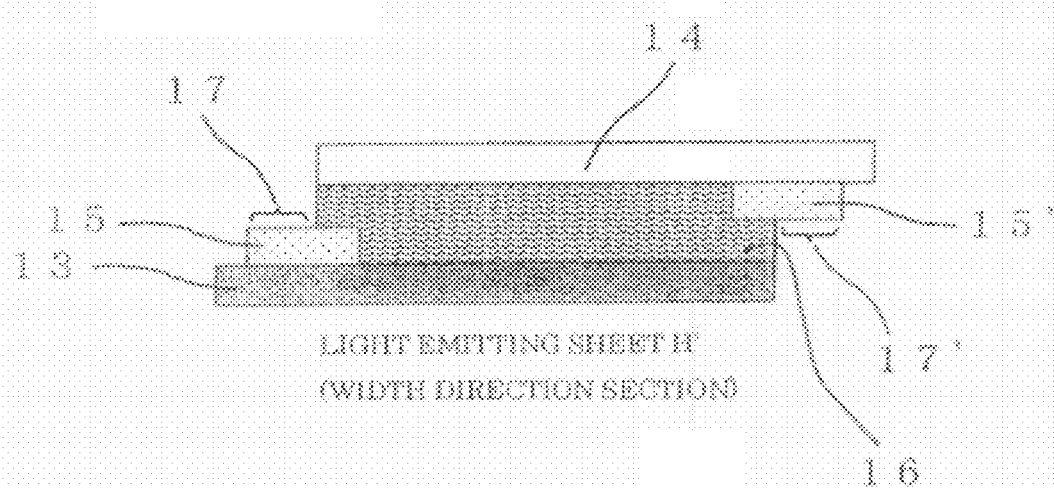
FIG. 17 is a width direction (lateral) sectional view of the light-emitting sheet H'.

Subsequently, on the one hand, the laminate 7 was unwound from the roll, and on the other the light-emitting layer-containing sheet was unwound from the roll while removing the second release film by using the laminator. As shown in FIG. 15, the light-emitting layer was then laminated on the first electrode surface of the laminate 7, thereby forming a laminate 9 having a light-emitting layer 16 provided thereon. The obtained laminate 9 was then wound-up into a roll. In this case, a length of the portion projected from the light-emitting layer 16 of the short circuit preventing member 15 (projected section 17 of short circuit preventing member) was made 5 mm (see FIG. 17).

Figure 16:
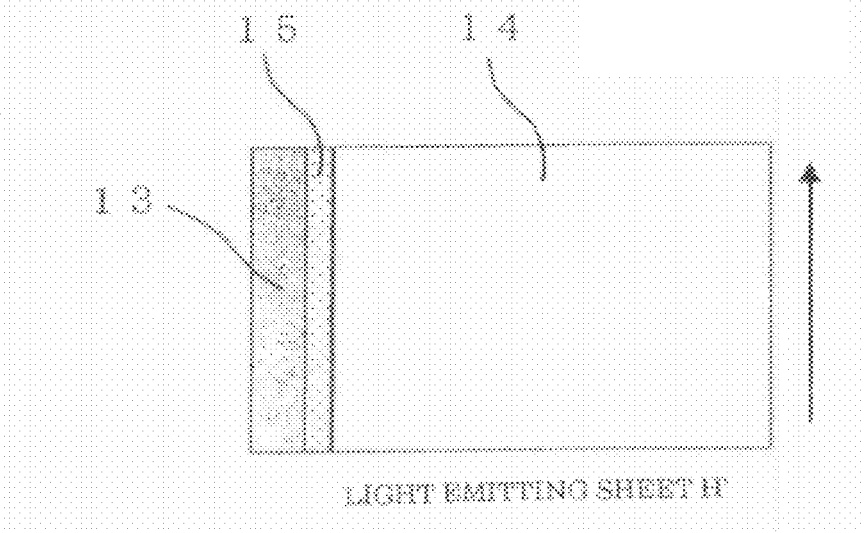
FIG. 16 is a diagram showing a light-emitting sheet H' having the laminate 8 bonded onto the laminate 9 unwound from a roll.

Subsequently, on the one hand, the laminate 8 was unwound, and on the other laminate 9 was unwound from the roll while removing the first release sheet, and as shown in FIG. 16, then were laminated in such a way that the second electrode surface of the laminate 8 was contacted with the light-emitting layer 16 of the laminate 9 and the short circuit preventing member 15' laminated on the laminate 8 was located on a right side, thereby forming a light-emitting sheet H', and the obtained light-emitting sheet H' was wound-up into a roll. It is noted that a length of the portion projected from the light-emitting layer 16 of the short circuit preventing member 15' (projected section 17' of short circuit preventing member) was made 5 mm (see FIG. 17).

Figure 18:
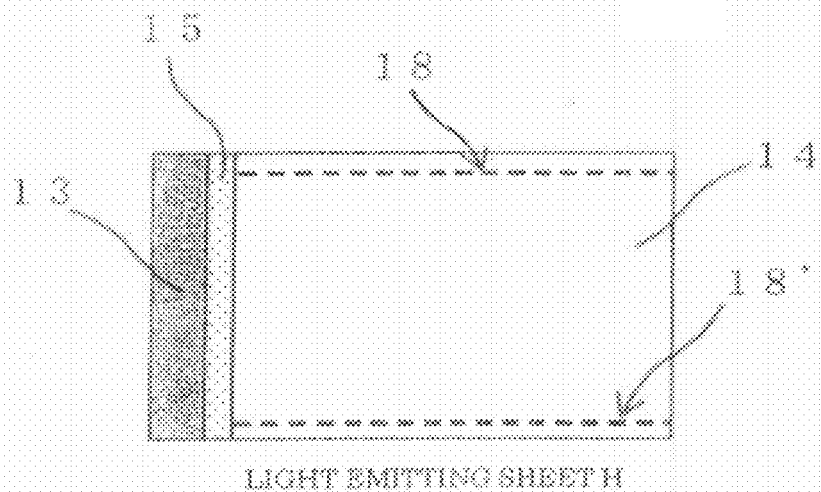
FIG. 18 is a diagram showing that any two places of a second electrode of the light-emitting sheet H' are cut using a laser beam machine (light-emitting sheet H).
Figure 19:
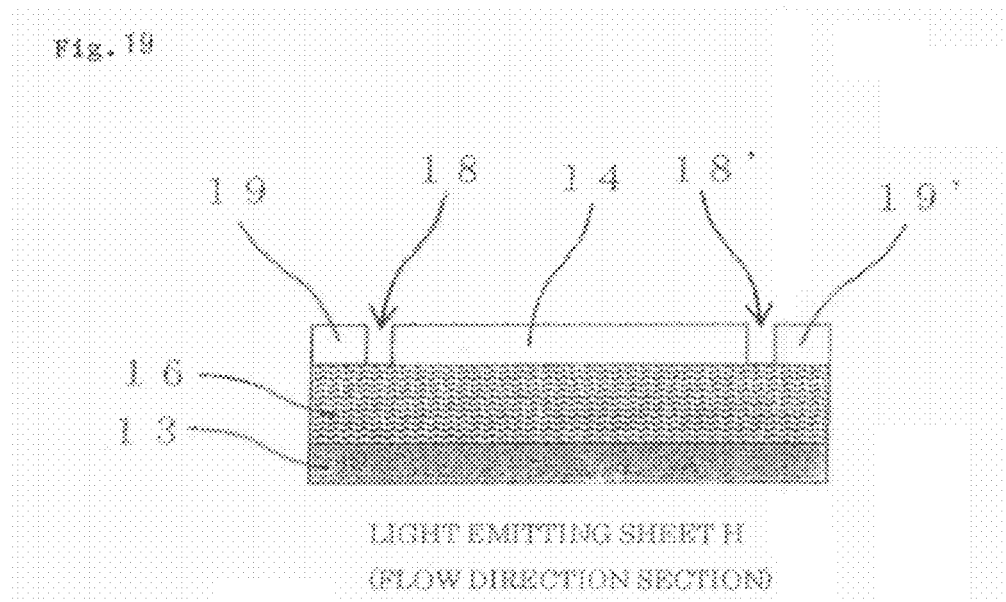
FIG. 19 is a flow direction (vertical) sectional view of the light-emitting sheet H.

Subsequently, as shown in FIG. 18, the second electrode substrate was cut along a width direction of the light-emitting sheet H' (laser cut sections 18 and 18') by using a laser beam machine under a condition at a laser output of 45 W and a scanning rate of 500 mm/s while unwinding the light-emitting sheet H' from the roll, to form non-conductive sections 19 and 19' shown in FIG. 19, thereby obtaining a light-emitting sheet H. It is noted that a width of each of the laser cut sections 18 and 18' was 143 µm, and a cut depth thereof was 76 µm.

Finally, the light-emitting sheet 8 was cut into a sheet along a width direction, to obtain a light-emitting sheet H. A length of from the end of the light-emitting sheet to each of the laser cut sections 18 and 18' was made 5 mm. A creepage distance of this light-emitting sheet H was found to be 5.055 mm.

The creepage distance and the results of each test relating to the obtained light-emitting sheet H are shown in Table 2.

Comparative Example 1

A light-emitting sheet I was obtained in the same manner as that in Example 1, except that the short circuit preventing members 2 and 2' were not laminated on the first electrode and the second electrode, respectively. A creepage distance of this light-emitting sheet I was found to be 0.055 mm.

The creepage distance and the results of each test relating to the obtained light-emitting sheet I are shown in Table 2.

Comparative Example 2

A light-emitting sheet J was obtained in the same manner as that in Example 6, except that the short circuit preventing members 8 and 8' were not laminated on the first electrode and the second electrode, respectively. A creepage distance of this light-emitting sheet J was found to be 0.055 mm.

The creepage distance and the results of each test relating to the obtained light-emitting sheet J are shown in Table 2.

Comparative Example 3

In Example 6, the light-emitting sheet F' was obtained without cutting the edge of the second electrode substrate 7 of the light-emitting sheet F'. A creepage distance of this light-emitting sheet F' was found to be 0.055 mm.

The creepage distance and the results of each test relating to the obtained light-emitting sheet F' are shown in Table 2.

TABLE 2

| | | Light emitting sheet | Creepage distance[1] (mm) | Test results | |
|---|---|---|---|---|---|
| | | | | Dielectric strength (V) | Presence or absence of short circuit |
| Example | 1 | A | 5.095 | 1,000 or more | Absence |
| | 2 | B | 5.104 | 1,000 or more | Absence |
| | 3 | C | 5.154 | 1,000 or more | Absence |
| | 4 | D | 10.095 | 1,000 or more | Absence |
| | 5 | E | 2.595 | 1,000 or more | Absence |
| | 6 | F | 5.055 | 1,000 or more | Absence |
| | 7 | G | 5.065 | 1,000 or more | Absence |
| | 8 | H | 5.055 | 1,000 or more | Absence |
| Comparative Example | 1 | I | 0.055 | 478 | Presence[2] |
| | 2 | J | 0.055 | 456 | Presence[2] |
| | 3 | F' | 0.055 | 488 | Presence[2] |

[1] A minimum value of the creepage distance of from the edge of the conductive section of the first electrode to the edge of the conductive section of the second electrode
[2] Black spots were confirmed immediately after application of a voltage.

From Table 2, the light-emitting sheet in which a short circuit preventing member composed of an insulator is arranged on the periphery of a light-emitting layer in such a way that apart of the member is projected from the light-emitting layer was high in dielectric strength properties and free from the short circuit at driving (see Examples 1 to 5).

The light-emitting sheet in which a short circuit preventing member composed of an insulator is arranged on at least apart of the periphery of a light-emitting layer in such a way that a part of the member is projected from the light-emitting layer, and furthermore, a first electrode and/or a second electrode on the periphery of the light-emitting layer in which the short circuit preventing member is not arranged or not arranged in such a way that a part of the member is projected from the light-emitting layer is cut to form a non-conductive section being electrically disconnected was also high in dielectric strength properties and free from the short circuit at driving (see Examples 6 and 7).

Also, the light-emitting sheet which was produced by a roll-to-roll process and in which a short circuit preventing member composed of an insulator is arranged on the peripheries of two sides of a light-emitting layer along a flow direction of the light-emitting layer in such a way that a part of the member is projected from the light-emitting layer, and furthermore, a first electrode and/or a second electrode is cut along a width direction to form a non-conductive section being electrically disconnected was also high in dielectric strength properties and free from the short circuit at driving (see Example 8).

On the other hand, in the light-emitting sheet in which a short circuit preventing member composed of an insulator is not arranged at all on the periphery of a light-emitting layer, not only the dielectric strength properties were low, but the short circuit was generated at driving (see Comparative Example 1).

Also, in the light-emitting sheet in which a short circuit preventing member composed of an insulator is not arranged in such a way that a part of the member is projected from a light-emitting layer (see Comparative Example 2) and the light-emitting sheet in which seen from a vertical direction to the plane of the light-emitting sheet, a first electrode and a second electrode on the periphery of a light-emitting layer in which no short circuit preventing member was arranged were not cut (see Comparative Example 3), not only the dielectric strength properties were low, but the short circuit was generated at driving.

INDUSTRIAL APPLICABILITY

The light-emitting sheet of the present invention is useful in fields where weather resistance, heat resistance, long-term stability, or the like is required, for example, backlight for advertising media disposed on windows of commercial buildings, automobiles, decorating media, security sheets, and the like.

EXPLANATIONS OF LETTERS OR NUMERALS

1: First electrode substrate
2, 2': Short circuit preventing member
3: Second electrode substrate
4: Light emitting layer
5, 5': Projected section of short circuit preventing member
6: First electrode substrate
7: Second electrode substrate
8, 8': Short circuit preventing member
9: Light emitting layer
10, 10': Projected section of short circuit preventing member
11, 11': Laser cut section
12, 12': Non-conductive section
13: First electrode substrate
14: Second electrode substrate
15, 15': Short circuit preventing member
16: Light emitting layer
17, 17': Projected section of short circuit preventing member
18, 18': Laser cut section
19, 19': Non-conductive section
20: First electrode substrate
21: Second electrode substrate
22: Light emitting layer
23: Side surface site of light-emitting layer (periphery of light-emitting layer)

The invention claimed is:

1. A light-emitting sheet comprising:
a first electrode;
a second electrode;
a light-emitting layer disposed between the first electrode and the second electrode; and
a short circuit preventing member composed of an insulator arranged continuously on at least a first peripheral portion of the light-emitting layer such that a part of the short circuit preventing member projects from the light-emitting layer,
wherein, on a second peripheral portion of the light-emitting layer in which the short circuit preventing member is not arranged or not arranged in such a way that the part of the short circuit preventing member projects from the light-emitting layer, at least one of the first electrode and the second electrode has a cut-out portion that forms a non-conductive section electrically disconnected from a circuit for applying a voltage to the light-emitting sheet.

2. The light-emitting sheet according to claim 1, wherein the cut-out portion of the at least one of the first electrode and the second electrode is cut with a laser.

3. The light-emitting sheet according to claim 1, wherein the short circuit preventing member projects from the light-emitting layer such that a minimum value of a creepage distance between the first electrode and the second electrode is 2 mm or more.

4. The light-emitting sheet according to claim 1, wherein, a minimum value of a creepage distance between a conductive section of the first electrode and a conductive section of the second electrode, which are electrically connected to each other, is 2 mm or more, based on cutting of the at least one of the first electrode and the second electrode.

5. The light-emitting sheet according to claim 1, wherein the short circuit preventing member is a pressure-sensitive adhesive sheet having an insulating property.

6. The light-emitting sheet according to claim 1, further comprising a dielectric layer between the first electrode or the second electrode and the light-emitting layer.

7. A method for producing a light-emitting sheet having a first electrode, a second electrode and a light-emitting layer disposed between the first electrode and the second electrode, the method comprising:
producing, using a roll-to-roll process, the light-emitting sheet;
arranging a short circuit preventing member composed of an insulator continuously on peripheral portions of both sides of the light-emitting layer in a flow direction of the light-emitting layer such that a part of the short circuit preventing member projects from the light-emitting layer; and
cutting at least one of the first electrode and the second electrode adjacent to the peripheral portions of both sides of the light-emitting layer along a width direction of the light-emitting layer to form a non-conductive section electrically disconnected from a circuit for applying a voltage to the light-emitting sheet.

8. A method for producing a light-emitting sheet having a first electrode, a second electrode and a light-emitting layer disposed between the first electrode and the second electrode, the method comprising:
producing the light-emitting sheet using a roll-to-roll process;
arranging a short circuit preventing member composed of an insulator continuously on a first peripheral portion of a first side of the light-emitting layer along a flow direction of the light-emitting layer such that a part of the short circuit preventing member projects from the light-emitting layer;
cutting the second electrode, which is disposed on or under a second peripheral portion of a second side of the light-emitting layer, to form a first non-conductive section electrically disconnected from a circuit for applying a voltage to the light-emitting sheet; and
cutting at least one of the first electrode and the second electrode adjacent to the first peripheral portion of the first side of the light-emitting layer and adjacent to the second peripheral portion of the second side of the light-emitting layer along a width direction of the light-emitting layer to form a second non-conductive section electrically disconnected from the circuit for applying a voltage to the light-emitting sheet.

9. The light-emitting sheet according to claim 3, wherein, the minimum value of the creepage distance between a conductive section of the first electrode and a conductive section of the second electrode, which are electrically connected to each other, is 2 mm or more, based on cutting of the at least one of the first electrode and the second electrode to form the cut-out portion.

10. The light-emitting sheet according to claim 3, wherein the short circuit preventing member is a pressure-sensitive adhesive sheet having an insulating property.

11. The light-emitting sheet according to claim 4, wherein the short circuit preventing member is a pressure-sensitive adhesive sheet having an insulating property.

12. The light-emitting sheet according to claim 9, wherein the short circuit preventing member is a pressure-sensitive adhesive sheet having an insulating property.

13. The light-emitting sheet according to claim 1, wherein, from a plan view of the light-emitting sheet, the short circuit preventing member and the non-conductive section surround the light-emitting layer.

14. The light-emitting sheet according to claim 1, wherein the first electrode and the second electrode are directly in contact with opposite sides of the light-emitting layer.

15. The light-emitting sheet according to claim 14, wherein the cut-out portion of the at least one of the first electrode and the second electrode extends to the light-emitting layer.

16. The light-emitting sheet according to claim 1, wherein the short circuit preventing member is sandwiched between the first electrode and the light-emitting layer and/or the second electrode and the light-emitting layer.

17. The light-emitting sheet according to claim 1, wherein only said at least one of the first electrode and the second electrode has the cut-out portion.

18. The light-emitting sheet according to claim 1, wherein the short circuit preventing member composed of the insulator is arranged directly on the at least first peripheral portion of the light-emitting layer.

19. The method of claim 7, wherein the short circuit preventing member composed of the insulator is arranged directly on the peripheral portions of both sides of the light-emitting layer.

20. The method of claim 8, wherein the short circuit preventing member composed of the insulator is arranged directly on the first peripheral portion of the first side of the light-emitting layer.

* * * * *